United States Patent
Jinta

(10) Patent No.: US 8,008,950 B2
(45) Date of Patent: Aug. 30, 2011

(54) BOOTSTRAP CIRCUIT THAT MAY BE USED IN A SHIFT REGISTER OR OUTPUT BUFFER

(75) Inventor: Seiichiro Jinta, Kanagawa (JP)

(73) Assignee: Sony Corporation, Tokyo (JP)

( * ) Notice: Subject to any disclaimer, the term of this patent is extended or adjusted under 35 U.S.C. 154(b) by 22 days.

(21) Appl. No.: 12/320,611

(22) Filed: Jan. 30, 2009

(65) Prior Publication Data

US 2009/0201071 A1    Aug. 13, 2009

(30) Foreign Application Priority Data

Feb. 8, 2008  (JP) ................................. 2008-028559

(51) Int. Cl.
  *H03K 3/00*  (2006.01)
(52) U.S. Cl. ......................... 327/108; 327/112; 345/100
(58) Field of Classification Search .................. 327/108, 327/112; 345/100
  See application file for complete search history.

(56) References Cited

U.S. PATENT DOCUMENTS

| 5,949,271 | A | 9/1999 | Fujikura et al. |
| 6,556,646 | B1 * | 4/2003 | Yeo et al. ........................ 377/54 |
| 7,120,221 | B2 * | 10/2006 | Moon ............................. 377/64 |
| 7,233,308 | B2 * | 6/2007 | Park ............................. 345/100 |

FOREIGN PATENT DOCUMENTS

JP    10-112645    4/1998

* cited by examiner

*Primary Examiner* — Kenneth B. Wells
(74) *Attorney, Agent, or Firm* — Rader, Fishman & Grauer PLLC

(57) ABSTRACT

Disclosed herein is a bootstrap circuit configured to employ first, second and third transistors of the same conduction type wherein: a node section connecting a gate electrode of the first transistor and a specific one of the source and drain areas of a third transistor to each other is put in a floating state when the third transistor is put in a turned-off state; a gate electrode of the second transistor is connected to a clock supply line which conveys the other one of the two clock signals; and a voltage-variation repression capacitor is provided between the node section and a first voltage supply line.

6 Claims, 25 Drawing Sheets

[FIRST EMBODIMENT]

[FIRST EMBODIMENT]

[FIRST EMBODIMENT]

[ACTUAL EXAMPLE (COMPARISON EXAMPLE)]

[FIRST EMBODIMENT]

[FIRST EMBODIMENT]

[SECOND EMBODIMENT]

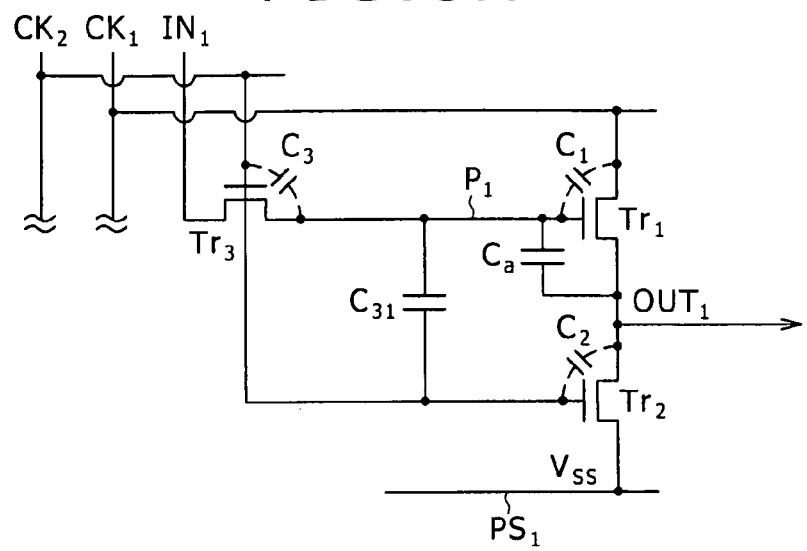

[FOURTH EMBODIMENT]

[FOURTH EMBODIMENT]

[FOURTH EMBODIMENT]

[FIFTH EMBODIMENT]

[SIXTH EMBODIMENT]

[SEVENTH EMBODIMENT]

[SEVENTH EMBODIMENT]

[SEVENTH EMBODIMENT]

[SEVENTH EMBODIMENT]

(RELATED ART)

(RELATED ART)

US 8,008,950 B2

BOOTSTRAP CIRCUIT THAT MAY BE USED IN A SHIFT REGISTER OR OUTPUT BUFFER

CROSS REFERENCES TO RELATED APPLICATIONS

The present invention contains subject matter related to Japanese Patent Application JP 2008-028559 filed in the Japan Patent Office on Feb. 8, 2008, the entire contents of which being incorporated herein by reference.

BACKGROUND OF THE INVENTION

1. Field of the Invention

The present invention relates to a bootstrap circuit used in a shift register circuit and an output buffer circuit.

2. Description of the Related Art

A shift register circuit is widely used as a scan circuit or a matrix array driving circuit in a display apparatus and a semiconductor memory apparatus.

At the output stage of a shift register circuit, a push-pull output circuit is generally used. If the push-pull output circuit is configured by making use of only transistors of the same conduction type, however, the output voltage of the push-pull output circuit cannot be assured sufficiently. If the push-pull output circuit is configured by making use of only transistors which are each created as a transistor of the n-channel type for example, a difference $V_{gs}$ in electric potential between a gate electrode and a source area in a transistor provided on the high electric-potential side of the push-pull output circuit drops as the output voltage of the push-pull output circuit rises. For $V_{gs} < V_{th}$ where reference notation $V_{th}$ denotes the threshold voltage of the transistor, the transistor is in a turned-off state. Thus, the push-pull output circuit generates the output voltage only for a range of $(V_{gs} - V_{th})$. In order to solve this problem, there has been proposed an output circuit which makes use of a bootstrap operation.

As a shift register circuit making use of a bootstrap operation, Japanese Patent Laid-open No. Hei 10-112645 used as Patent Document 1 in this patent specification discloses a transistor circuit having a typical configuration shown in a circuit diagram of FIG. 25. As shown in the circuit diagram of FIG. 25, the typical configuration basically employs three transistors per stage. In the case of the typical configuration shown in the circuit diagram of FIG. 25, three transistors $Tr_1$, $Tr_2$ and $Tr_3$ of typically the n-channel type are employed at every stage of the configuration.

The shift register circuit having a typical configuration shown in the circuit diagram of FIG. 25 is explained as follows. FIG. 26A is a circuit diagram showing a typical configuration of a bootstrap circuit provided at the first stage of the shift register circuit whereas FIG. 26B is a timing diagram showing a model of timing charts of signals relevant to operations carried out by the bootstrap circuit shown in the circuit diagram of FIG. 26A. By paying attention to the first stage of the shift register circuit shown in the circuit diagram of FIG. 26A, the reader will be aware of the fact that a first transistor $Tr_1$ and a second transistor $Tr_2$ together compose a push-pull output circuit. A specific one of the source and drain areas of the first transistor $Tr_1$ and a specific one of the source and drain areas of the second transistor $Tr_2$ are connected to each other by an output section $OUT_1$ of the bootstrap circuit provided at the first stage. A transistor has two areas, i.e., source and drain areas which are referred to as a specific one of the source and drain areas and the other one of the source and drain areas respectively in this patent specification. By the same token, two clock signals having phases different from each other are referred to as a specific one of the clock signals and the other one of the clock signals respectively in this patent specification.

The other one of the source and drain areas of the first transistor $Tr_1$ is connected to a clock supply line which conveys a specific one of the two clock signals $CK_1$ and $CK_2$ having phases different from each other as shown in the timing diagram of FIG. 26B. In the case of the first stage of the typical shift register circuit shown in the circuit diagram of FIG. 26A, the specific one of the two clock signals $CK_1$ and $CK_2$ is the clock signal $CK_1$. The other one of the source and drain areas of the second transistor $Tr_2$ is connected to a first voltage supply line conveying a first voltage $V_{ss}$ which is set typically at a low level of 0 V. The gate electrode of the first transistor $Tr_1$ and a specific one of the source and drain areas of the third transistor $Tr_3$ are connected to each other by a node section $P_1$. The gate electrodes of the second transistor $Tr_2$ and the third transistor $Tr_3$ are connected to a clock supply line conveying the other one of the two clock signals $CK_1$ and $CK_2$. In the case of the first stage of the typical shift register circuit shown in the circuit diagram of FIG. 26A, the other one of the two clock signals $CK_1$ and $CK_2$ is thus the clock signal $CK_2$. The other one of the source and drain areas of the third transistor $Tr_3$ is connected to a signal supply line which conveys an input signal $IN_1$.

It is to be noted that, between the gate electrode of the first transistor $Tr_1$ and the specific one of the source and drain areas of the first transistor $Tr_1$, between the gate electrode of the first transistor $Tr_1$ and the other one of the source and drain areas of the first transistor $Tr_1$ or between the gate electrode of the first transistor $Tr_1$ and the specific one of the source and drain areas of the first transistor $Tr_1$ as well as between the gate electrode of the first transistor $Tr_1$ and the other one of the source and drain areas of the first transistor $Tr_1$, a capacitor serving as bootstrap capacitor may be connected in some cases. In the case of the first stage of the typical shift register circuit shown in the circuit diagram of FIG. 25 or 26A, a capacitor $C_a$ serving as bootstrap capacitor is connected between the gate electrode of the first transistor $Tr_1$ and the specific one of the source and drain areas of the first transistor $Tr_1$. Typically, the bootstrap capacitor $C_a$ is composed of two conductive layers sandwiching an insulation layer. As an alternative, the bootstrap capacitor $C_a$ can also be the so-called MOS (Metal Oxide Semiconductor) capacitor.

By referring to the timing charts shown in the timing diagram of FIG. 26B, operations carried out by the first stage of the typical shift register circuit are explained as follows. It is to be noted that the high level of each of the two clock signals $CK_1$ and $CK_2$ having phases different from each other and the input signal $IN_1$ is a second voltage $V_{dd}$ which is set typically at 5 V. On the other hand, the low level of each of these signals is the aforementioned first voltage $V_{ss}$ which is set typically at 0 V as described above. In the following description, reference notation $V_{thi}$ denotes the threshold voltage of an ith transistor. For example, reference notation $V_{th3}$ denotes the threshold voltage of the third transistor $Tr_3$.

Time Period $T_1$

In the time period $T_1$, each of the input signal $IN_1$ and the first clock signal $CK_1$ is set at a low level whereas the second clock signal $CK_2$ is set at a high level. The input signal $IN_1$ set at the low level is supplied to the gate electrode of the first transistor $Tr_1$ by way of the third transistor $Tr_3$ which is in a turned-on state. Thus, the electric potential appearing at the gate electrode of the first transistor $Tr_1$ and the node section $P_1$ is also set at the low level, putting the first transistor $Tr_1$ in a turned-off state. Since the second clock signal $CK_2$ is set at a high level, on the other hand, the second transistor $Tr_2$ is put in a turned-on state as the third transistor $Tr_3$ is. Thus, the output section $OUT_1$ is pulled down by the second transistor $Tr_2$ put in a turned-on state to the first voltage $V_{ss}$ which is a voltage at a low level.

Time Period $T_2$

In the time period $T_2$, the first clock signal $CK_1$ is set at the high level whereas the second clock signal $CK_2$ is set at the low level. Since the third transistor $Tr_3$ is put in a turned-off state, the node section $P_1$ is put in a floating state of holding the electric potential which has been set during the time period $T_1$. That is to say, the node section $P_1$ is put in a floating state of sustaining the electric potential which has been set at the low level. Thus, the first transistor $Tr_1$ is maintaining the turned-off state. On the other hand, the state of the second transistor $Tr_2$ is changed from the turned-on state to the turned-off state. As a result, the output section $OUT_1$ is put in a floating state of being connected to a capacitive load which is not shown in the circuit diagram of FIG. 26A. That is to say, the output section $OUT_1$ is sustaining the electric potential which has been set at the low level during the time period $T_1$.

Time Period $T_3$

In the time period $T_3$, each of the input signal $IN_1$ and the second clock signal $CK_2$ is set at the high level whereas the first clock signal $CK_1$ is set at the low level. The third transistor $Tr_3$ is put in a turned-on state, supplying the input signal $IN_1$ set at the high level to the node section $P_1$. Thus, the electric potential appearing on the node section $P_1$ rises. As the electric potential appearing on the node section $P_1$ attains an electric potential of $(V_{dd}-V_{th3})$, the third transistor $Tr_3$ is put in a turned-off state, putting the node section $P_1$ in a floating state of holding the electric potential of $(V_{dd} V_{th3})$. Each of the first transistor $Tr_1$ and the second transistor $Tr_2$ is in a turned-on state. The first clock signal $CK_1$ set at the same low level as the first voltage $V_{ss}$ is supplied to the other one of the source and drain areas of the first transistor $Tr_1$. The other one of the source and drain areas of the second transistor $Tr_2$ is also connected to a first voltage supply line which conveys the first voltage V. Thus, the first voltage $V_s$, appears on the output section $OUT_1$, setting the output section $OUT_1$ at a low level.

Time Period $T_4$

In the time period $T_4$, the first clock signal $CK_1$ is set at the high level whereas each of the input signal $IN_1$ and the second clock signal $CK_2$ is set at the low level. Since the second clock signal $CK_2$ is set at the low level, each of the second transistor $Tr_2$ and the third transistor $Tr_3$ is in a turned-off state. The node section $P_1$ is put in a floating state whereas the first transistor $Tr_1$ is put in a turned-on state. Thus, the first transistor $Tr_1$ connects the output section $OUT_1$ to the first clock supply line conveying the first clock signal $CK_1$ set at the high level, raising the electric potential appearing on the output section $OUT_1$. At that time, due to a bootstrap operation through a bootstrap capacitor such as the gate capacitor of the first transistor $Tr_1$, the electric potential appearing on the node section $P_1$ rises to a level at least equal to the second voltage $V_{dd}$. Thus, the second voltage $V_{dd}$ is output as the high level of the output section $OUT_1$.

Time Period $T_5$

In the time period $T_5$, each of the input signal $IN_1$ and the first clock signal $CK_1$ is set at the low level whereas the second clock signal $CK_2$ is set at the high level. When the second clock signal $CK_2$ is set at the high level, each of the second transistor $Tr_2$ and the third transistor $Tr_3$ is put in a turned-on state. The second transistor $Tr_2$ put in a turned-on state connects the output section $OUT_1$ to the first voltage supply line conveying the first voltage $V_{ss}$. Thus, the output section $OUT_1$ is reset to the low level. On the other hand, the third transistor $Tr_3$ put in a turned-on state connects the node section $P_1$ to the input signal $IN_1$ which is set at the low level. Thus, the node section $P_1$ is also reset to the low level.

Time Period $T_6$

In the time period $T_6$, the first clock signal $CK_1$ is set at the high level whereas each of the input signal $IN_1$ and the second clock signal $CK_2$ is set at the low level. The operation carried out in the time period $T_6$ is basically the same as the operation carried out in the time period $T_2$. Since the third transistor $Tr_3$ is put in a turned-off state, the node section $P_1$ is put in a floating state of holding the electric potential set at the low level. Thus, the first transistor $Tr_1$ is maintaining the turned-off state. On the other hand, the state of the second transistor $Tr_2$ is changed from the turned-on state to the turned-off state. As a result, the output section $OUT_1$ is sustaining the electric potential set at the low level.

SUMMARY OF THE INVENTION

In the explanation of the operations carried out by the bootstrap circuit described above, effects of a variety of abrupt level changes generated through capacitors such as parasitic capacitors are not taken into consideration. In actuality, however, the electric potentials appearing on floating members such as the node section $P_1$ varies due to the effects of a variety of abrupt level changes generated through capacitors such as parasitic capacitors. In addition, the higher the operating speed of the bootstrap circuit, the higher the speeds at which a pulse rises and falls so that the stronger the effects of a variety of abrupt level changes generated through capacitors such as parasitic capacitors. Strong effects of a variety of abrupt level changes generated through capacitors such as parasitic capacitors cause the bootstrap circuit to operate incorrectly.

Addressing the problems described above, inventors of the present invention have innovated a bootstrap circuit employed in a shift register circuit and an output buffer circuit to serve as a bootstrap circuit capable of reducing the number of effects of a variety of abrupt level changes generated through capacitors such as parasitic capacitors.

A bootstrap circuit provided in accordance with a first, second, third or fourth mode of the present invention to serve as a bootstrap circuit capable of reducing the number of aforementioned effects is configured to employ first, second and third transistors. In the bootstrap circuit:

(A-1) a specific one of the source and drain areas of the first transistor and a specific one of the source and drain areas of the second transistor are connected to each other by an output section of the bootstrap circuit;

(A-2) the other one of the source and drain areas of the first transistor is connected to a clock supply line which conveys a specific one of two clock signals having phases different from each other;

(A-3) the gate electrode of the first transistor and a specific one of the source and drain areas of the third transistor are connected to each other by a node section;

(B-1) the other one of the source and drain areas of the second transistor is connected to a first voltage supply line which conveys a first predetermined voltage;

(C-1) the other one of the source and drain areas of the third transistor is connected to a signal supply line which conveys an input signal supplied to the bootstrap circuit;

(C-2) the gate electrode of the third transistor is connected to a clock supply line which conveys the other one of the two clock signals; and the node section connecting the gate electrode of the first transistor and the specific one of the source and drain areas of the third transistor to each other is put in a floating state when the third transistor is put in a turned-off state.

In the bootstrap circuit provided in accordance with the first mode of the present invention to serve as a bootstrap circuit capable of reducing the number of aforementioned effects:

the gate electrode of the second transistor is connected to the clock supply line which conveys the other one of the two clock signals having phases different from each other; and a voltage-variation repression capacitor is provided between the node section and the first voltage supply line.

Since the voltage-variation repression capacitor is provided between the node section and the first voltage supply line, it is possible to repress variations of an electric potential appearing on the node section when the third transistor is put in a turned-off state as well as electric-potential variations which appear on the node section due to the two clock signals.

The bootstrap circuit provided in accordance with the first mode of the present invention is further provided with a fourth transistor having the same conduction type as the first to third transistors. In this bootstrap circuit:

(D-1) a specific one of the source and drain areas of the fourth transistor is connected to the gate electrode of the first transistor;

(D-2) the other one of the source and drain areas of the fourth transistor is connected by a junction point to the specific one of the source and drain areas of the third transistor; and (D-3) the gate electrode of the fourth transistor is a connected to a second voltage supply line conveying a second predetermined voltage.

In the case of the configuration described above, the voltage-variation repression capacitor can be provided between the first voltage supply line and the junction point connecting the other one of the source and drain areas of the fourth transistor to the specific one of the source and drain areas of the third transistor. In this configuration, the fourth transistor splits the node section, which is put into a floating state when the third transistor is put in a turned-off state, into portions. By setting the second predetermined voltage at a level that puts the fourth transistor in a turned-off state in a bootstrap operation, the voltage-variation repression capacitor is disconnected from the node section in the bootstrap operation. Thus, this configuration offers a merit that a bootstrap gain does not decrease even if the voltage-variation repression capacitor is provided between the first voltage supply line and the node section.

In the bootstrap circuit provided in accordance with the second mode of the present invention to serve as a bootstrap circuit capable of reducing the number of aforementioned effects:

the gate electrode of the second transistor is connected to the clock supply line which conveys the other one of the two clock signals having phases different from each other; and a voltage-variation repression capacitor is provided between the node section and the gate electrode of the second transistor.

In the bootstrap circuit provided in accordance with the second mode of the present invention, the capacitance of the voltage-variation repression capacitor included in the configuration of the bootstrap circuit is set at such a value that electric-potential variations caused by abrupt level changes generated by the two clock signals having phases different from each other as abrupt level changes to the node section cancel each other. Thus, it is possible to repress variations of a electric potential appearing on the node section.

The bootstrap circuit according to the third mode of the present invention is also provided with a fourth transistor having the same conduction type as the first to third transistors as well as provided with an inverter circuit. In the bootstrap circuit:

(E-1) a specific one of the source and drain areas of the fourth transistor is connected by a junction point to the input side of the inverter circuit, the output side of which is connected to the gate electrode of the second transistor;

(E-2) the other one of the source and drain areas of the fourth transistor is connected to the input supply line; and (E-3) the gate electrode of the fourth transistor is connected to the clock supply line which conveys the other one of the two clock signals.

In an operation determined in advance, the output of the inverter circuit sustains the turned-on state of the second transistor in order to maintain a state of applying a voltage generated by the other one of the source and drain areas of the second transistor to the output section. It is thus possible to repress voltage variations generated by the output section due to variations exhibited by a leak current flowing in the first transistor as leak-current variations caused by variations of an electric potential appearing on the node section.

It is possible to provide an alternative configuration in which a voltage-variation repression capacitor is wired between the first voltage supply line and the junction point connecting the specific one of the source and drain areas of the fourth transistor to the input side of the inverter circuit. Since this voltage-variation repression capacitor functions as a capacitor for repressing variations of a voltage appearing on the input side of the inverter circuit, the operation carried out by the inverter circuit can be made more stable.

It is also possible to provide the bootstrap circuit provided in accordance with the third mode of the present invention with a desirable configuration in which a special capacitor is provided between the other one of the source and drain areas of the first transistor and the junction point connecting the specific one of the source and drain areas of the fourth transistor to the input side of the inverter circuit.

In the bootstrap circuit provided in accordance with the fourth mode of the present invention to serve as a bootstrap circuit capable of reducing the number of aforementioned effects:

the gate electrode of the second transistor is connected to the clock supply line which conveys the other one of the two clock signals having phases different from each other;

the bootstrap circuit is further provided with at least one of circuit sections each employing a fourth transistor and a fifth transistor which have the same conduction type as the first to third transistors;

in each of the circuit sections:

(F-1) the gate electrode of the fourth transistor is connected by a junction point to a specific one of the source and drain areas of the fifth transistor; and (F-2) the other one of the source and drain areas of the fifth transistor is connected to the signal supply line which conveys the input signal;

the specific one of the two clock signals having phases different from each other is supplied to the other one of the source and drain areas of the first transistor by way of the fourth transistor connected in series between the clock supply line supplying the specific one of the two clock signals and the other one of the source and drain areas of the first transistor.

The bootstrap circuit provided in accordance with the fourth mode of the present invention can be configured to include a bootstrap capacitor wired between the output section of the bootstrap circuit and the junction point connecting the gate electrode of the fourth transistor to the specific one of the source and drain areas of the fifth transistor. Also in each of the circuit sections each employing the fourth and fifth transistors in the bootstrap circuit provided in accordance with the fourth mode of the present invention to serve as a bootstrap circuit including the desirable configuration described above, a bootstrap operation takes place. In other words, the bootstrap circuit provided in accordance with the fourth mode of the present invention includes a configuration in which a plurality of circuit sections each for carrying out a bootstrap operation are connected to each other in parallel.

In the configuration described above, it is possible to repress variations of an electric potential which appears on the node section when the third transistor is put in a turned-off state and electric-potential variations which appear on the node section due to the two clock signals.

Each of the bootstrap circuits provided in accordance with the first, second, third and fourth modes of the present invention can be configured to employ transistors each created as a transistor of the n-channel type or transistors each created as a transistor of the p-channel type. It is to be noted that, in the following description, each of the bootstrap circuits provided in accordance with the first, second, third and fourth modes of the present invention is referred to simply as a bootstrap circuit provided by the present invention in some cases. Each of the transistors can be a TFT (Thin Film Transistor) or a transistor created on a semiconductor substrate. The structure of each of the transistors is not prescribed in particular. In the following description, each of the transistors is explained as a transistor of an enhancement type. However, each of the transistors is by no means limited to the transistor of the enhancement type. For example, each of the transistors can also be a transistor of a depletion type. In addition, each of the transistors can be a transistor of single-gate type or a dual-gate type.

For example, on a substrate used for constructing a liquid-crystal display apparatus of an active-matrix type, pixel electrodes and driving transistors each connected to one of the pixel electrodes are created. In addition, on the same substrate, circuits such as a scan circuit making use of bootstrap circuits can also be created. In such a configuration, it is convenient to configure the bootstrap circuit to employ transistors of the same conduction type as the driving transistors. Since the transistors each created on the substrate to serve as a driving transistor and the transistors each created on the substrate to serve as a bootstrap-circuit transistor of the scan circuit have the same conduction type, the transistors can be created in the same process. Other display apparatus including an organic electro luminescence display apparatus can also be constructed in the same way as the liquid-crystal display apparatus.

Each of the capacitors employed in the bootstrap circuit is typically composed of two conductive layers sandwiching an insulation layer. As an alternative, each of the capacitors can also be the so-called MOS capacitor. Each of elements employed in the bootstrap circuit to serve as elements including the transistors, the capacitors and wires used as the signal supply lines, the voltage supply lines, the clock supply lines as well as components connecting the lines can be created from known materials by adoption of known methods. Proper configurations for the elements including the transistors, the capacitors and the wires as well as proper methods for creating the elements are selected in accordance with, among others, the specifications of an apparatus employing the bootstrap circuit.

The configuration of the inverter circuit employed in the bootstrap circuit provided in accordance with the third mode of the present invention is not prescribed in particular. Basically, however, it is desirable to construct the inverter circuit from transistors each having the same conduction type as the other transistors composing the bootstrap circuit provided in accordance with the third mode of the present invention. For example, an inverter circuit created from transistors having a uniform conduction type is disclosed in Japanese Patent Laid-open No. 2005-143068. The bootstrap circuit provided in accordance with the third mode of the present invention may employ the inverter circuit disclosed in this document. In addition, a variety of inverter circuits are proposed in Japanese Patent Application No. 2008-26742 and Japanese Patent Application No. 2008-26743. By the same token, the bootstrap circuit provided in accordance with the third mode of the present invention may employ any of the inverter circuits disclosed in these documents.

Each of the bootstrap circuits provided in accordance with the embodiments of the present invention is capable of reducing the number of effects of a variety of abrupt level changes generated through capacitors such as parasitic capacitors. Thus, in each of application circuits such as a shift register circuit and an output buffer circuit which employ one of the bootstrap circuits each provided in accordance with the embodiments is capable of reducing the number of circuit incorrect operations caused by a variety of such abrupt level changes.

BRIEF DESCRIPTION OF THE DRAWINGS

FIG. 8A is a circuit diagram showing a typical configuration of a bootstrap circuit implemented by a third embodiment to serve as a bootstrap circuit at the first stage of the scan circuit;

FIG. 8B is a timing diagram showing a model of timing charts of signals relevant to operations carried out by the bootstrap circuit implemented by the third embodiment to serve as a bootstrap circuit at the first stage of the scan circuit;

FIGS. 12B and 12C are a timing diagrams showing a model of timing charts of signals relevant to operations carried out by the inverter circuit shown in the circuit diagram of FIG. 12A;

DETAILED DESCRIPTION OF THE PREFERRED EMBODIMENTS

Preferred embodiments of the present invention are explained by referring to diagrams as follows.

First Embodiment

Figure 1:
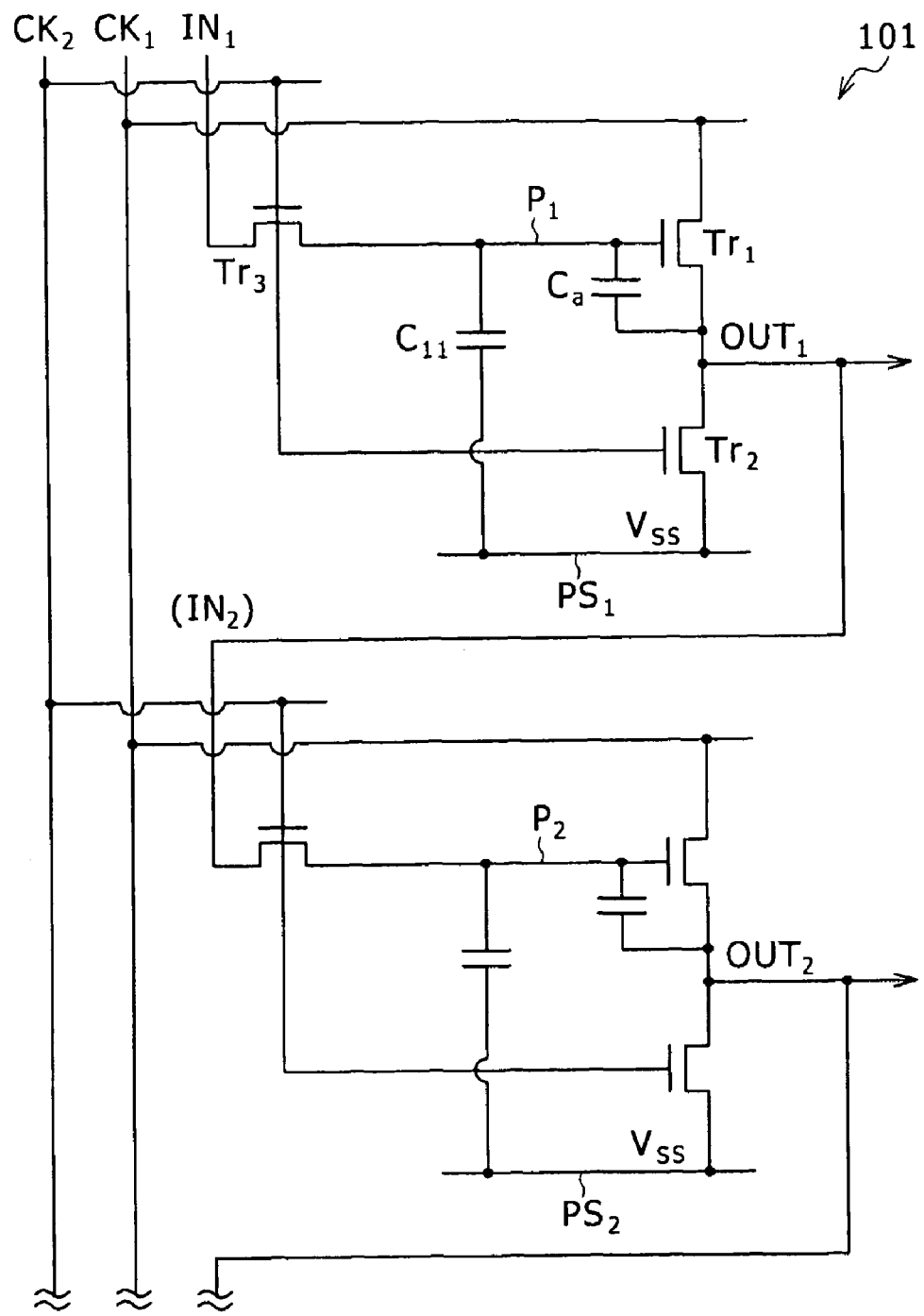
FIG. 1 is a circuit diagram showing a typical configuration of a scan circuit composed of a bootstrap circuit provided in accordance with a first embodiment of the present invention at every stage.
Figure 2A:
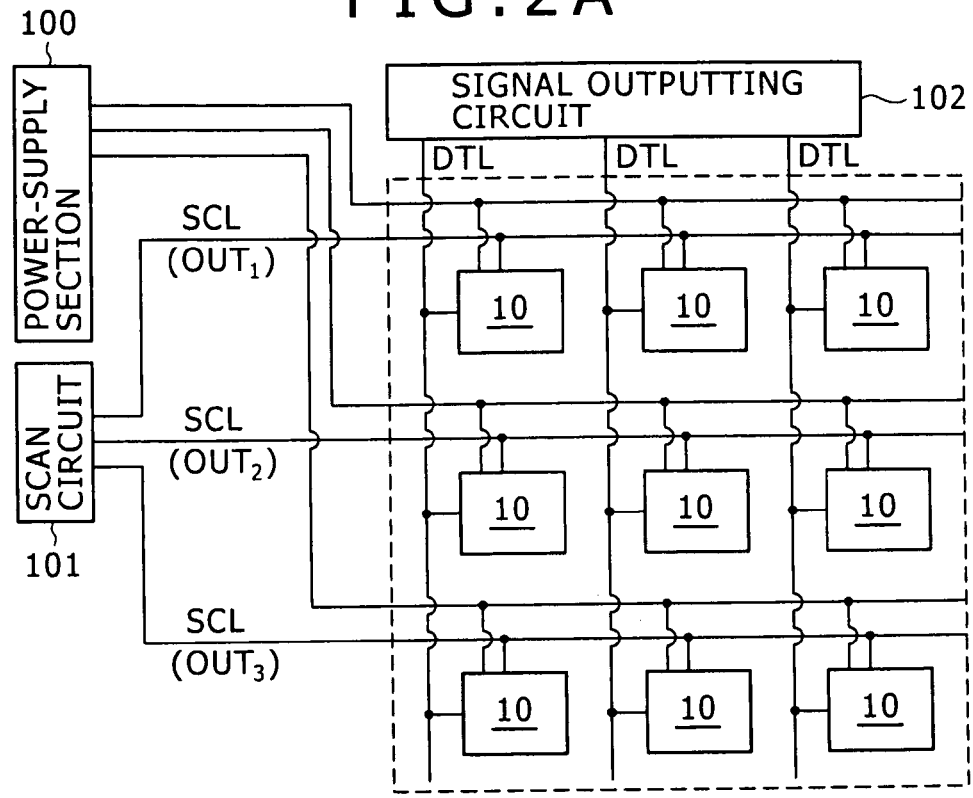
FIG. 2A is a conceptual block diagram showing a typical configuration of an organic EL (electro luminescence) display apparatus employing the scan circuit and a plurality of organic electro luminescence devices which each serve as a light emitting device.
Figure 2B:
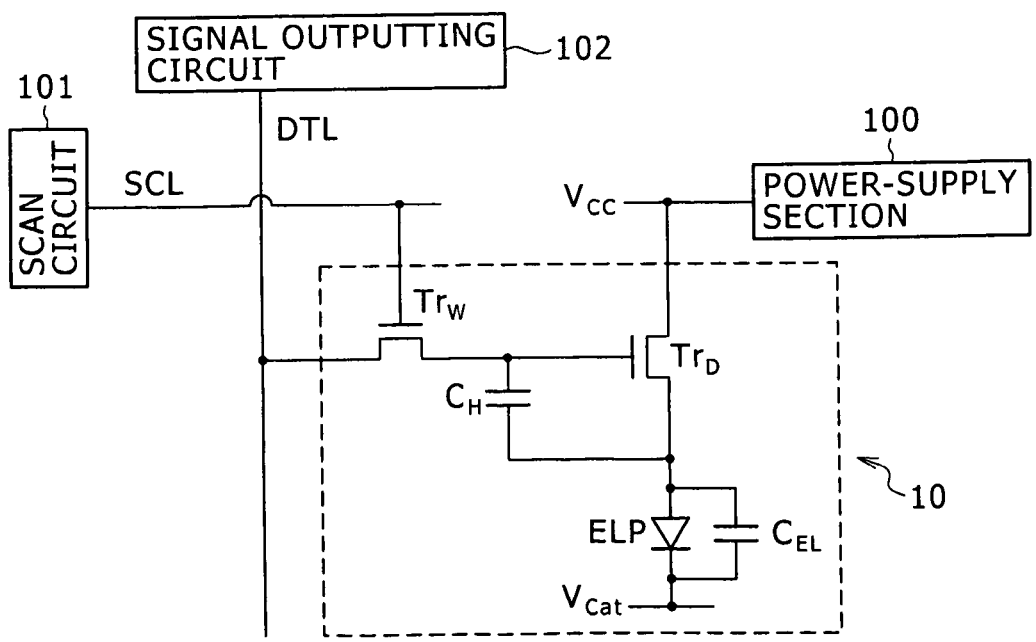
FIG. 2B is a conceptual block diagram showing a typical configuration of the organic EL display apparatus by focusing on a model of the circuit of one organic EL device.

A first embodiment of the present invention implements a bootstrap circuit provided in accordance with the first mode of the present invention. FIG. 1 is a circuit diagram showing a typical configuration of a scan circuit 101 composed of bootstrap circuits each provided in accordance with the first embodiment of the present invention at every stage. It is to be noted that, for the sake of convenience, the typical scan circuit 101 shown in the circuit diagram of FIG. 1 employs only two bootstrap circuits at the first and second stages respectively. FIGS. 2A and 2B are a plurality of conceptual block diagrams each showing a typical configuration of an organic electro luminescence display apparatus which is referred to hereafter simply as an organic EL display apparatus. To be more specific, FIG. 2A is a conceptual block diagram showing a typical configuration of the organic EL display apparatus employing the scan circuit 101 and a plurality of organic electro luminescence devices 10 each referred to simply as an organic EL device. In the organic EL display apparatus, each of the organic electro luminescence devices 10 serves as a light emitting device. On the other hand, FIG. 2B is a conceptual block diagram showing a typical configuration of the organic EL display apparatus by focusing on a model circuit of one organic EL device 10.

The bootstrap circuit provided in accordance with the first embodiment of the present invention is explained with reference to the circuit diagram of FIG. 1 by paying attention only to the first stage of the scan circuit 101 shown in the diagram. The bootstrap circuit provided in accordance with the first embodiment of the present invention employs a first transistor $Tr_1$, a second transistor $Tr_2$ and a third transistor $Tr_1$ which have the same conduction type. In the case of the bootstrap circuit provided in accordance with the first embodiment of the present invention, each of the first transistor $Tr_1$, the second transistor $Tr_2$ and the third transistor $Tr_3$ has the same conduction type which is the conduction type of an n-channel transistor as will be described later.

In the bootstrap circuit provided in accordance with the first embodiment of the present invention:

(A-1) a specific one of the source and drain areas of the first transistor $Tr_1$ and a specific one of the source and drain areas of the second transistor $Tr_2$ are connected to each other by an output section $OUT_1$ of the bootstrap circuit;

(A-2) the other one of the source and drain areas of the first transistor $Tr_1$ is connected to a clock supply line which conveys a specific one of two clock signals $CK_1$ and $CK_2$ having phases different from each other;

(A-3) the gate electrode of the first transistor $Tr_1$ and a specific one of the source and drain areas of the third transistor $Tr_3$ are connected to each other by a node section $P_1$;

(B-1) the other one of the source and drain areas of the second transistor $Tr_2$ is connected to a first voltage supply line $PS_1$ conveying a first predetermined voltage $V_{Ss}$ which is set at a typical electric potential of 0 V;

(C-1) the other one of the source and drain areas of the third transistor $Tr_3$ is connected to a signal supply line which conveys an input signal $IN_1$ supplied to the bootstrap circuit;

(C-2) the gate electrode of the third transistor $Tr_3$ is connected to a clock supply line which conveys the other one of the two clock signals $CK_1$ and $CK_2$; and the node section $P_1$ connecting the gate electrode of the first transistor $Tr_1$ and the specific one of the source and drain areas of the third transistor $Tr_3$ to each other is put in a floating state when the third transistor $Tr_3$ is put in a turned-off state.

In addition, the gate electrode of the second transistor $Tr_2$ is connected to the clock supply line which conveys the other one of the two clock signals $CK_1$ and $CK_2$ having phases different from each other. (In the case of the bootstrap circuit provided in accordance with the first embodiment of the present invention, the other one of two clock signals $CK_1$ and $CK_2$ is the clock signal $CK_2$ as shown in the circuit diagram of FIG. 1). On top of that, a voltage-variation repression capacitor $C_{11}$ is connected between the first sub-node section $P_1$ and the first voltage supply line $PS_1$.

In the case of the bootstrap circuit provided in accordance with the first embodiment of the present invention, the voltage-variation repression capacitor $C_{11}$ is configured to employ two conductive layers and an insulation layer sandwiched by the two conductive layers. It is to be noted that, as explained earlier in the paragraph with a title of "Description of the Related Art," a capacitor is also connected between the gate electrode of the first transistor $Tr_1$ and the specific one of the source and drain areas of the first transistor $Tr_1$ to serve as a bootstrap capacitor $C_a$. Much like the voltage-variation repression capacitor $C_{11}$ the bootstrap capacitor $C_a$ is also configured to employ two conductive layers and an insulation layer sandwiched by the two conductive layers.

It is also worth noting that, as explained earlier in the paragraph with a title of "Description of the Related Art," the high level of each of the two clock signals $CK_1$ and $CK_2$ having phases different from each other and the input signal $IN_1$ is the level of the second voltage $V_{dd}$ which is set typically at 5 V. On the other hand, the low level of each of these signals is the level of the aforementioned first voltage $V_{as}$ which is set typically at 0 V as described above. In addition, the threshold voltage of the third transistor $Tr_1$ is denoted by reference notation $V_{th3}$.

First of all, the following description explains the configuration of the organic EL display apparatus employing the scan circuit 101 and operations carried out by the organic EL display apparatus. As shown in the conceptual block diagram of FIG. 2A, the organic EL display apparatus includes:

(1) the scan circuit 101;

(2) a signal outputting circuit 102;

(3) N×M aforementioned organic EL devices 10 laid out to form a two-dimensional matrix composed of N arrays arranged in a first direction and M arrays arranged in a second direction different from the first direction;

(4) M scan lines SCL each connected to the scan circuit 101 and each stretched in the first direction;

(5) N data lines DTL each connected to the signal outputting circuit 102 and each stretched in the second direction (in particular, in a direction perpendicular to the first direction); and (6) a power-supply section 100.

It is to be noted that, in the conceptual block diagram of FIG. 2A, the matrix is shown to be composed of only 3×3 organic EL devices just for the sake of convenience. That is to say, the matrix is no more than a typical matrix. The components such as the scan circuit 101, the organic. EL devices 10, the scan lines SCL and the data lines DTL are created on a substrate which is not shown in the conceptual block diagrams of FIG. 2A. The substrate is typically made of glass.

A light emitting device ELP is designed into a known configuration and a known structure which typically include an anode electrode, a hole transport layer, a light emitting layer, an electron transport layer and a cathode electrode. By the same token, each of the signal outputting circuit 102, the scan lines SCL, the data lines DTL and the power-supply section 100 can also be designed into a known configuration and a known structure.

As shown in the conceptual block diagram of FIG. 2B, in addition to the light emitting device ELP, the organic EL device 10 also employs a driving circuit which includes a driving transistor $Tr_D$, a signal writing transistor $Tr_W$ and a signal holding capacitor $C_H$. It is to be noted that reference notation $C_E$ denotes the capacitance of the light emitting device ELP.

Each of the driving transistor $Tr_D$ and the signal writing transistor $Tr_W$ is a TFT (Thin Film Transistor) of the n-channel type. The TFT has source and drain areas, a channel creation area as well as a gate electrode. The driving circuit is also created on the aforementioned substrate which is not shown in the conceptual block diagrams of FIG. 2B. The light emitting device ELP is created in a predetermined area on the same substrate so as to cover this driving circuit.

In the same way as the driving transistor $Tr_D$ and the signal writing transistor $Tr_W$, each of the first transistor $Tr_1$, the second transistor $Tr_2$ and the third transistor $Tr_3$ which are employed in the scan circuit 101 is also an n-channel TFT having source and drain areas, a channel creation area as well as a gate electrode. By the same token, each of the first transistor $Tr_1$, the second transistor $Tr_2$ and the third transistor $Tr_3$ is also created on the aforementioned substrate which is not shown in the conceptual block diagrams of FIG. 2B. In addition, each of other elements such as a fourth transistor employed in other embodiments to be described later is also created on the same substrate.

A specific one of the source and drain areas of the driving transistor $Tr_D$ is connected to the power-supply section 100 generating a voltage $V_{cc}$ set at a typical high level of 20 V. The other one of the source and drain areas of the driving transistor $Tr_D$ is connected to the anode electrode of the light emitting device ELP and a specific one of the terminals of the signal holding capacitor $C_H$. The gate electrode of the driving transistor $Tr_D$ is connected to the other one of the source and drain areas of the signal writing transistor $Tr_W$ and the other one of the terminals of the signal holding capacitor $C_H$. A specific one of the source and drain areas of the signal writing transistor $Tr_W$ is connected to the data line DTL whereas the gate electrode of the signal writing transistor $Tr_W$ is connected to the scan line SCL. The cathode electrode of the light emitting device ELP is connected to a voltage supply line conveying a voltage $V_{cat}$ set at a typical low level of 0 V. The organic EL device 10 is driven by adoption of an active-matrix driving method as follows.

For example, when the top scan line SCL driven by the scan circuit 101 as shown in the conceptual block diagram of FIG. 2A is set by the scan circuit 101 at a high level, the signal writing transistor $Tr_W$ employed in every organic EL device 10 connected to the scan line SCL is put in a turned-on state, supplying a video signal asserted by the signal outputting circuit 102 on the data line DTL to the other one of the terminals of the signal holding capacitor $C_H$. When the top scan line SCL is set by the scan circuit 101 at a low level, on the other hand, the signal writing transistor $Tr_W$ is put in a turned-off state. With the signal writing transistor $Tr_W$ put in a turned-off state, however, a difference in electric potential between the gate electrode of the driving transistor $Tr_D$ and the source area of the driving transistor $Tr_D$ is sustained by the signal holding capacitor $C_H$ at a value according to the video signal. Thus, a current according to the magnitude of the video signal flows from the power-supply section 100 to the light emitting device ELP by way of the driving transistor $Tr_D$, causing the light emitting device ELP to emit light.

Figure 3A:
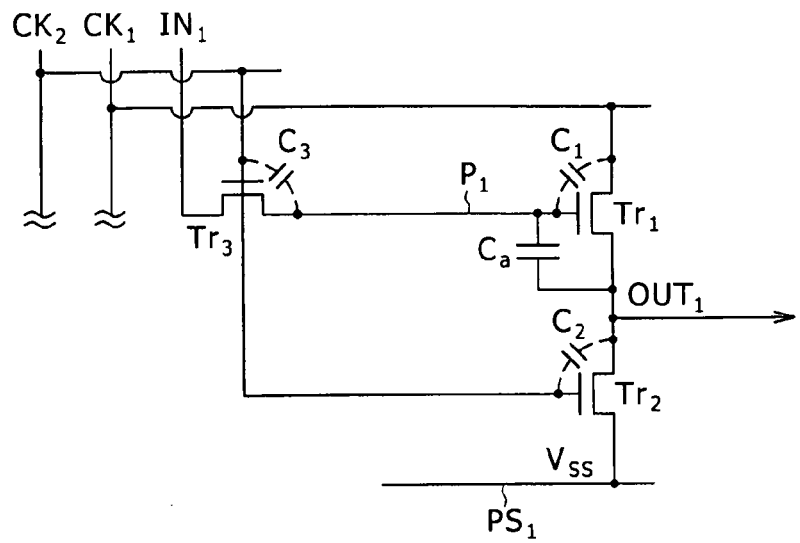
FIG. 3A is a circuit diagram showing a typical configuration of the bootstrap circuit in related art including parasitic capacitors.
Figure 3B:
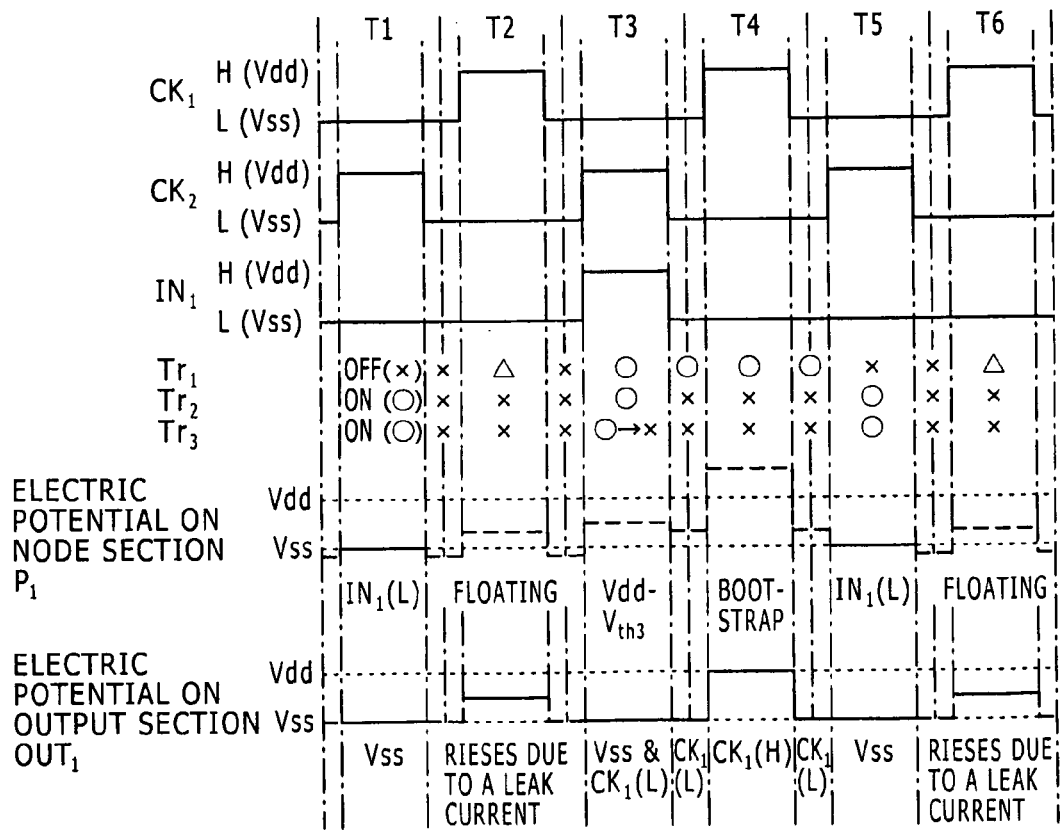
FIG. 3B is a timing diagram showing a model of timing charts of signals relevant to operations carried out by the bootstrap circuit in related art including the parasitic capacitors.
Figure 26A:
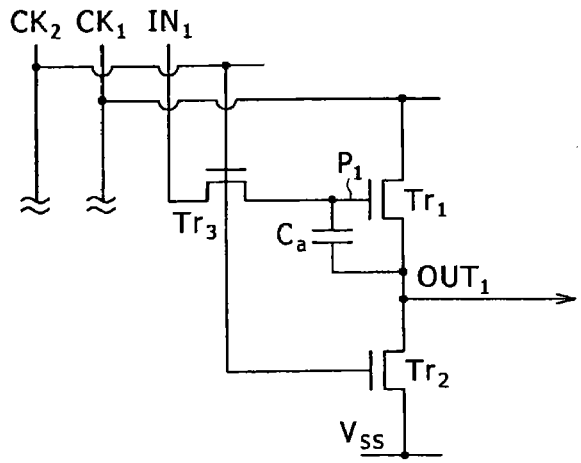
FIG. 26A is a circuit diagram showing a typical configuration of a bootstrap circuit provided at the first stage of the shift register circuit.
Figure 26B:
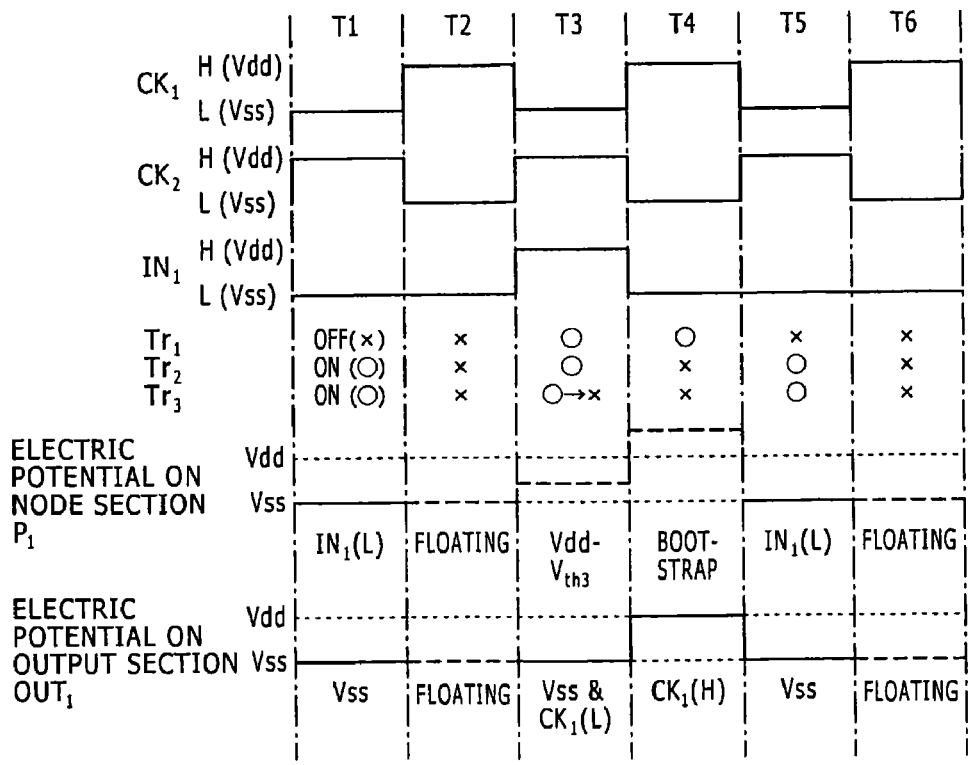
FIG. 26B is a timing diagram showing a model of timing charts of signals relevant to operations carried out by the bootstrap circuit shown in the circuit diagram of FIG. 26A.

In order to make the explanation of the first embodiment easy to understand, the following description explains an operation carried out by the bootstrap circuit in the related art by taking parasitic capacitors into consideration. FIG. 3A is a circuit diagram showing a typical configuration of the bootstrap circuit in related art including the parasitic capacitors whereas FIG. 3B is a timing diagram showing a model of timing charts of signals relevant to operations carried out by the bootstrap circuit in related art including the parasitic capacitors. It is to be noted that, in order to help the reader understand the description with ease, unlike the timing diagram of FIG. 26B, in the case of the timing diagram of FIG. 3B, there are time periods during which both the two clock signals $CK_1$ and $CK_2$ are put at a low level.

In the circuit diagram of FIG. 3A, reference notation $C_1$ denotes a parasitic capacitor between the gate electrode of the first transistor $Tr_1$ and the other one of the source and drain areas of the first transistor $Tr_1$, reference notation $C_2$ denotes a parasitic capacitor between the gate electrode of the second transistor $Tr_2$ and the specific one of the source and drain areas of the second transistor $Tr_2$ whereas reference notation $C_3$ denotes a parasitic capacitor between the gate electrode of the third transistor $Tr_3$ and the specific one of the source and drain areas of the third transistor $Tr_3$.

In the bootstrap circuit shown in the diagram of FIG. 3A, when the third transistor $Tr_3$ is put in a turned-off state, the node section $P_1$ enters a floating state. As described earlier, the gate electrode of the first transistor $Tr_1$ is a portion of the node section $P_1$ whereas the first clock signal $CK_1$ is supplied to the other one of the source and drain areas of the first transistor $Tr_1$. The gate electrode of the first transistor $Tr_1$ is electro-statically coupled by the parasitic capacitor $C_1$ with the other one of the source and drain areas of the first transistor $Tr_1$. On the other hand, the second clock signal $CK_2$ is supplied to the gate electrode of the third transistor $Tr_3$ whereas the specific one of the source and drain areas of the third transistor $Tr_3$ is a portion of the node section $P_1$. The gate electrode of the third transistor $Tr_3$ is electro-statically coupled by the parasitic capacitor $C_3$ with the specific one of the source and drain areas of the third transistor $Tr_3$.

When both the first transistor $Tr_1$ and the second transistor $Tr_2$ are put in a turned-off state, the output section $OUT_1$ of the bootstrap circuit enters a floating state. The second clock signal $CK_2$ is also supplied to the gate electrode of the second transistor $Tr_2$ whereas the specific one of the source and drain areas of the second transistor $Tr_2$ is a portion of the output section $OUT_1$. The gate electrode of the second transistor $Tr_2$ is electro-statically coupled by the parasitic capacitor $C_2$ with the specific one of the source and drain areas of the second transistor $Tr_2$. On the other hand, the gate electrode of the first transistor $Tr_1$ is a portion of the node section $P_1$ as described above whereas the specific one of the source and drain areas of the first transistor $Tr_1$ is a portion of the output section $OUT_1$. The gate electrode of the first transistor $Tr_1$ is electro-statically coupled by the bootstrap capacitor $C_a$ with the specific one of the source and drain areas of the first transistor $Tr_1$. It is to be noted that, in actuality, a parasitic capacitor not shown in the circuit diagram of FIG. 3A also exists between the gate electrode of the first transistor $Tr_1$ and the specific one of the source and drain areas of the first transistor $Tr_1$. Since the electrostatic coupling provided by the bootstrap capacitor $C_a$ is predominant in comparison with the parasitic capacitor existing between the gate electrode of the first transistor $Tr_1$ and the specific one of the source and drain areas of the first transistor $Tr_1$, however, the parasitic capacitor existing between the gate electrode of the first transistor $Tr_1$ and the specific one of the source and drain areas of the first transistor $Tr_1$ is not taken into account for the sake of convenience.

Operations carried out during time periods $T_1$ to $T_6$ shown in the timing diagram of FIG. 3B are basically similar to operations explained earlier by referring to the timing diagram of FIG. 26B as the operations carried out during the time periods $T_1$ to $T_6$. For this reason, basic operations carried out by the bootstrap circuit shown in the diagram of FIG. 3A are not described in order to avoid duplications of explanations.

As described above, the gate electrode of the first transistor $Tr_1$ is a portion of the node section $P_1$ whereas the first clock signal $CK_1$ is supplied to the other one of the source and drain areas of the first transistor $Tr_1$. The gate electrode of the first transistor $Tr_1$ is electro-statically coupled by the parasitic capacitor $C_1$ with the other one of the source and drain areas of the first transistor $Tr_1$. On the other hand, the second clock signal $CK_2$ is supplied to the gate electrode of the third transistor $Tr_3$ whereas the specific one of the source and drain areas of the third transistor $Tr_3$ is a portion of the node section $P_1$. The gate electrode of the third transistor $Tr_3$ is electro-statically coupled by the parasitic capacitor $C_3$ with the specific one of the source and drain areas of the third transistor $Tr_3$. Thus, with the third transistor $Tr_3$ put in a turned-off state, an electric potential appearing on the node section $P_1$ changes in accordance with rises and falls of the two clock signals $CK_1$ and $CK_2$. In the time periods $T_2$ and $T_6$ shown in the timing diagram of FIG. 3B for example, within which the first transistor $Tr_1$ is in an uncertain state (shown as a triangle in FIG. 3B), the electric potential appearing on the node section $P_1$ rises on the rising edge of the first clock signal $CK_1$. As described above, the first clock signal $CK_1$ is supplied to the other one of the source and drain areas of the first transistor $Tr_1$. Thus, if the electric potential appearing on the node section $P_1$ rises undesirably to a level of an order enabling a leak current to flow through the first transistor $Tr_1$, the first clock signal $CK_1$ results in the leak current which raises an electric potential appearing on the output section $OUT_1$. As a result, there is raised a problem that the electric potential appearing on the output section $OUT_1$ cannot be sustained at a low level during the time periods $T_2$ and $T_6$ as shown in the timing diagram of FIG. 3B.

Figure 4A:
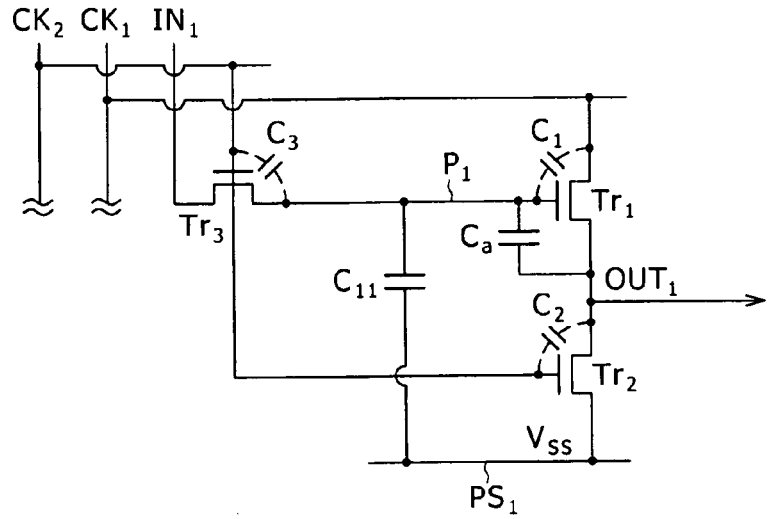
FIG. 4A is a circuit diagram showing a typical configuration of a bootstrap circuit employing a voltage-variation repression capacitor.
Figure 4B:
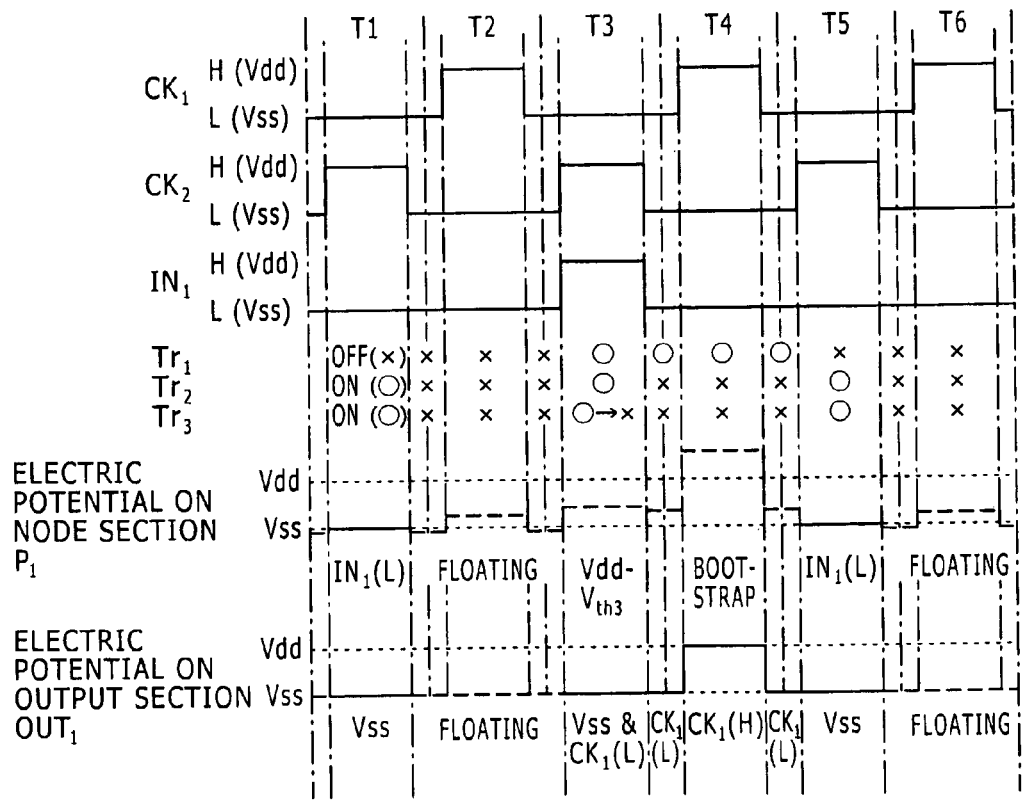
FIG. 4B is a timing diagram showing a model of timing charts of signals relevant to operations carried out by the bootstrap circuit employing the voltage-variation repression capacitor.

FIG. 4A is a circuit diagram showing a typical configuration of a bootstrap circuit provided at the first stage of the scan circuit 101 employing a voltage-variation repression capacitor $C_{11}$ whereas FIG. 4B is a timing diagram showing a model of timing charts of signals relevant to operations carried out by the bootstrap circuit employing the voltage-variation repression capacitor $C_{11}$.

As described above, in the bootstrap circuit provided in accordance with the first embodiment, the voltage-variation repression capacitor $C_{11}$ is connected between the node section $P_1$ and the first voltage supply line $PS_1$. Since the voltage-variation repression capacitor $C_{11}$ represses variations of the electric potential appearing on the node section $P_1$ when the third transistor $Tr_1$ is put in a turned-off state, a rise caused by a rise of the first clock signal $CK_1$ during each of the time periods $T_2$ and $T_6$ shown in the timing diagram of FIG. 4B as a rise of the electric potential appearing on the node section $P_1$ is suppressed. It is thus possible to solve the problem that the electric potential appearing on the output section $OUT_1$ cannot be sustained at a low level during the time periods $T_2$ and $T_6$ as shown in the timing diagram of FIG. 4B. As described above, this problem is raised because the electric potential appearing on the node section $P_1$ rises undesirably to a level of an order enabling a leak current to flow through the first transistor $Tr_1$ so that the first clock signal $CK_1$ supplied to the other one of the source and drain areas of the first transistor $Tr_1$ results in the leak current which raises an electric potential appearing on the output section $OUT_1$.

It is to be noted, however, that the voltage-variation repression capacitor $C_{11}$ connected between the node section $P_1$ and the first voltage supply line $PS_1$ does reduce bootstrap gain $g_b$. The bootstrap gain $g_b$ of the bootstrap circuit provided in accordance with the first embodiment is expressed by Eq. (1) given below. In the following equation, reference notation $C_{Tr1}$ denotes the gate capacitance of the first transistor $Tr_1$.

$$g_b = (C_{Tr1} + C_a + C_1)/(C_{11} + C_3 + C_{Tr1} + C_a + C_1) \tag{1}$$

Let reference notation $V_{th1}$ denote the threshold voltage of the first transistor $Tr_1$. At the beginning of a time period $T_4$ shown in the timing diagram of FIG. 4B, it is necessary to set a voltage appearing between the gate and source electrodes of the first transistor $Tr_1$ at a level exceeding the threshold voltage $V_{th1}$ of the first transistor $Tr_1$. Thus, the voltage-variation repression capacitor $C_{11}$ is required to have a capacitance meeting the condition. In addition, it is desirable to provide the voltage-variation repression capacitor $C_{11}$ which has a sufficiently large capacitance in comparison with the bootstrap capacitor $C_a$.

By the way, in a shift register circuit serving as the scan circuit 101 shown in the circuit diagram of FIG. 1, a signal output by a bootstrap circuit provided at a particular stage is supplied to a bootstrap circuit provided at the immediately succeeding stage. For example, a signal output by the output section $OUT_1$ of the bootstrap circuit provided at the first stage is supplied as an input signal $IN_2$ to the bootstrap circuit provided at the second stage.

Figure 5A:
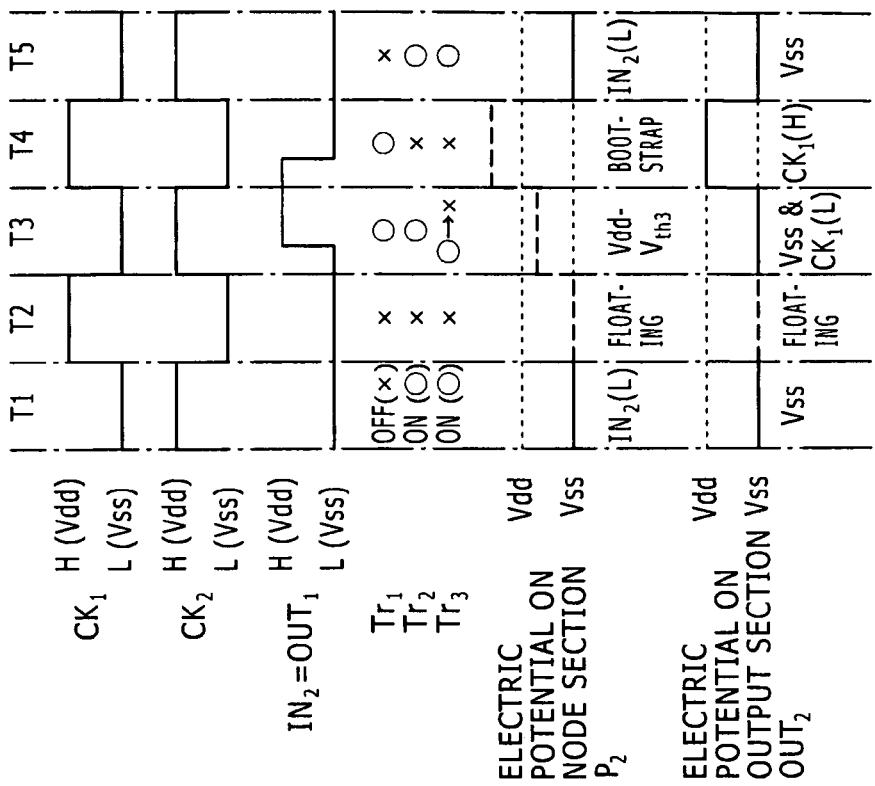
FIG. 5A is a timing diagram showing a model of timing charts of signals relevant to operations carried out by the shift register circuit serving as the scan circuit of FIG. 1 for a case in which a signal supplied to a bootstrap circuit provided at a specific stage has a phase leading ahead of the phase of a signal supplied to a bootstrap circuit provided at stage immediately preceding the specific stage.
Figure 5B:
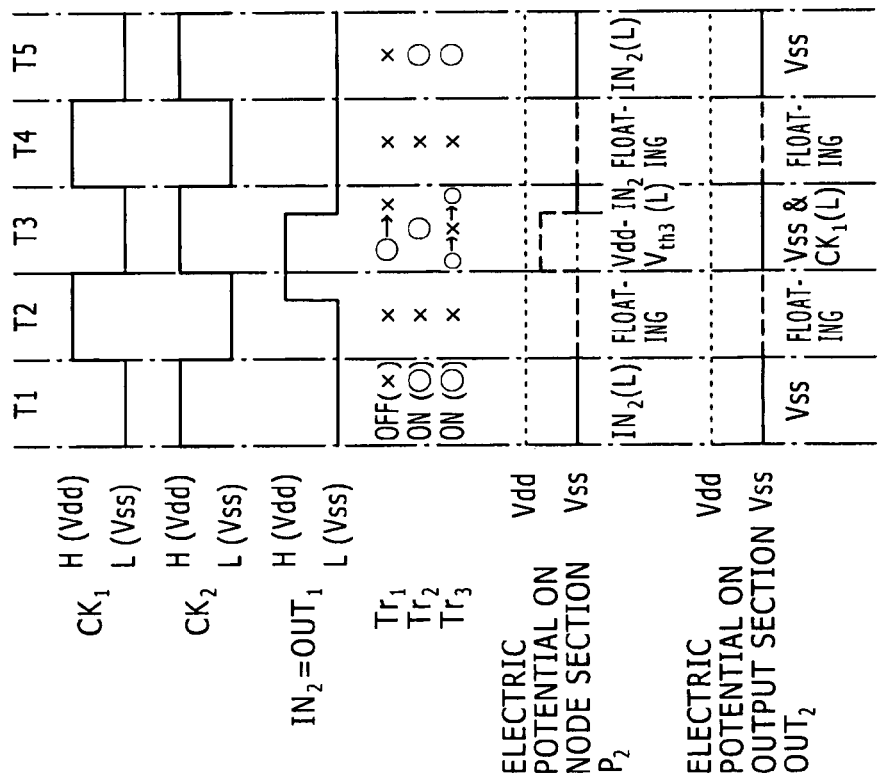
FIG. 5B is a timing diagram showing a model of timing charts of signals relevant to operations carried out by the shift register circuit serving as the scan circuit of FIG. 1 for a case in which a signal supplied to a bootstrap circuit provided at a specific stage has a phase lagging behind the phase of a signal supplied to a bootstrap circuit provided at a stage immediately preceding the specific stage.
Figure 6A:
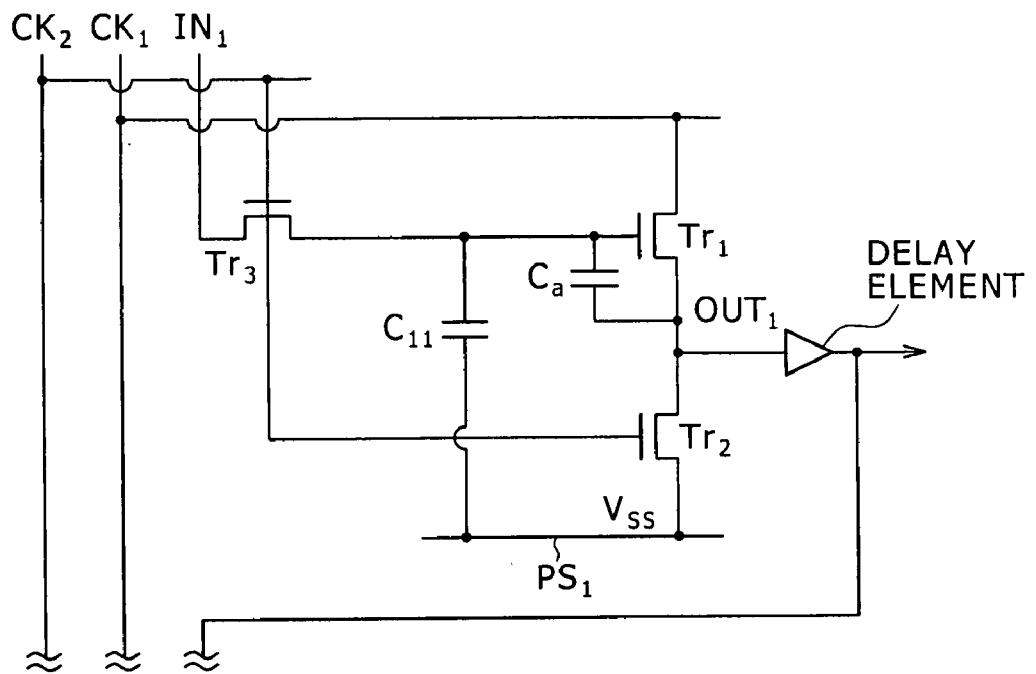
FIGS. 6A and 6B are a plurality of circuit diagrams each showing a typical configuration of a bootstrap circuit provided at a specific stage to serve as a bootstrap circuit outputting a signal to another bootstrap circuit, which is provided at a stage immediately succeeding the specific stage, by way of a delay element.
Figure 6B:
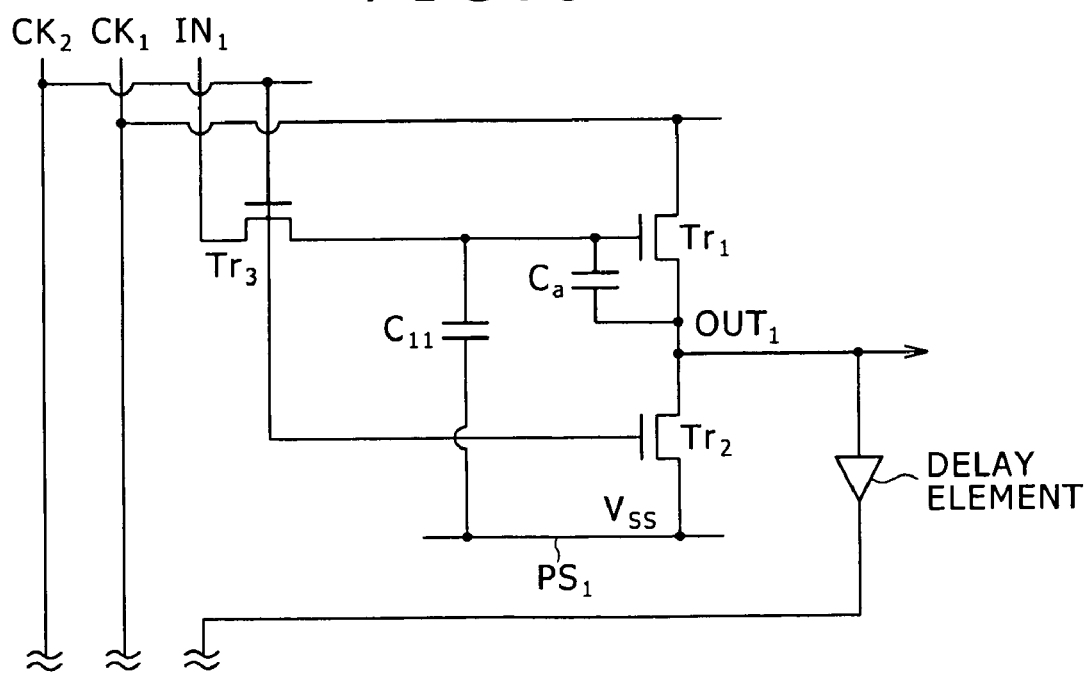

FIG. 5A is a timing diagram showing a model of timing charts of signals relevant to operations carried out by the scan circuit 101 shown in FIG. 1 for a case in which a signal supplied to a bootstrap circuit provided at a specific stage has a phase leading ahead of the phase of a signal supplied to a bootstrap circuit provided at stage immediately preceding the specific stage. On the other hand, FIG. 5B is a timing diagram showing a model of timing charts of signals relevant to operations carried out by the scan circuit 101 shown in FIG. 1 for a case in which a signal supplied to a bootstrap circuit provided at a specific stage has a phase lagging behind the phase of a signal supplied to a bootstrap circuit provided at stage immediately preceding the specific stage. In each of the timing diagrams of FIGS. 5A and 5B, the signal supplied to a bootstrap circuit provided at the specific stage is denoted by reference notation $IN_2=OUT_1$. If a signal supplied to a bootstrap circuit provided at a specific stage has a phase leading ahead of the phase of a signal supplied to a bootstrap circuit provided at a stage immediately preceding the specific stage as shown in the timing diagram of FIG. 5A, bootstrap operations are not carried out by the bootstrap circuit normally in the timing periods $T_3$ and $T_4$ at the specific stage. If a signal supplied to a bootstrap circuit provided at a specific stage has a phase lagging behind the phase of a signal supplied to a bootstrap circuit provided at stage immediately preceding the specific stage as shown in the timing diagram of FIG. 5B, on the other hand, the bootstrap operations are carried out by the bootstrap circuit without generating problems in the timing periods $T_3$ and $T_4$ at the specific stage. Thus, in order to make the bootstrap operations carried out by the bootstrap circuit provided at the specific stage reliable, it is possible to provide a configuration in which a signal output by the bootstrap circuit provided at a stage immediately preceding the specific stage is supplied to the bootstrap circuit provided at the specific stage by way of a delay element as shown in a circuit diagram of FIG. 6A or 6B. One of elements such as a buffer circuit, a capacitor or a resistor can be properly selected in accordance with the design of the scan circuit 101 to serve as the delay element. The delay element can also be used in other embodiments to be described later.

Second Embodiment

A second embodiment is obtained by modifying the first embodiment. In the same way as the first embodiment, the following description explains the configuration of a bootstrap circuit implemented by the second embodiment to serve as a bootstrap circuit at the first stage of the scan circuit 101 and explains operations carried out by the bootstrap circuit. Since the configuration of the organic EL display apparatus and operations carried out by the organic EL display apparatus for the second embodiment are basically the same as those of the first embodiment, the configuration of the organic EL display apparatus and operations carried out by the organic EL display apparatus for the second embodiment are not explained in order to avoid duplications of descriptions. That is to say, only differences in configuration and operations between the first and second embodiments are explained. Also in the case of the other embodiments to be described later, the explanation of the configuration and operations except such differences is omitted as well.

Figure 7A:
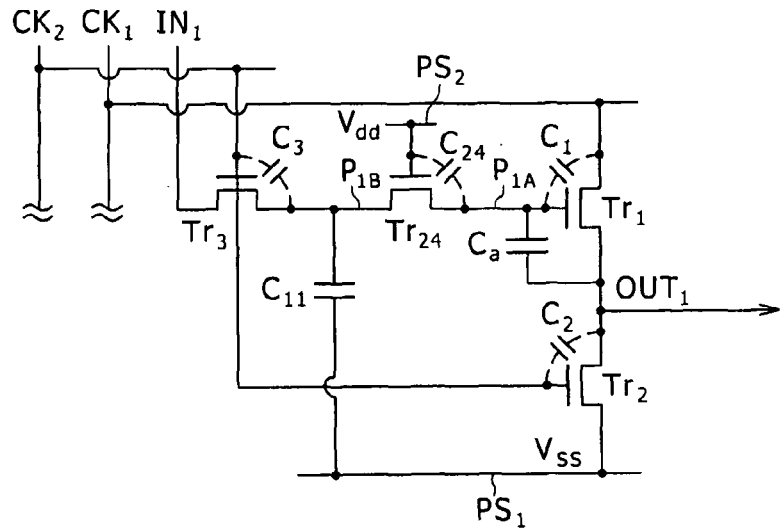
FIG. 7A is a circuit diagram showing a typical configuration of a bootstrap circuit implemented by a second embodiment to serve as a bootstrap circuit at the first stage of the scan circuit.
Figure 7B:
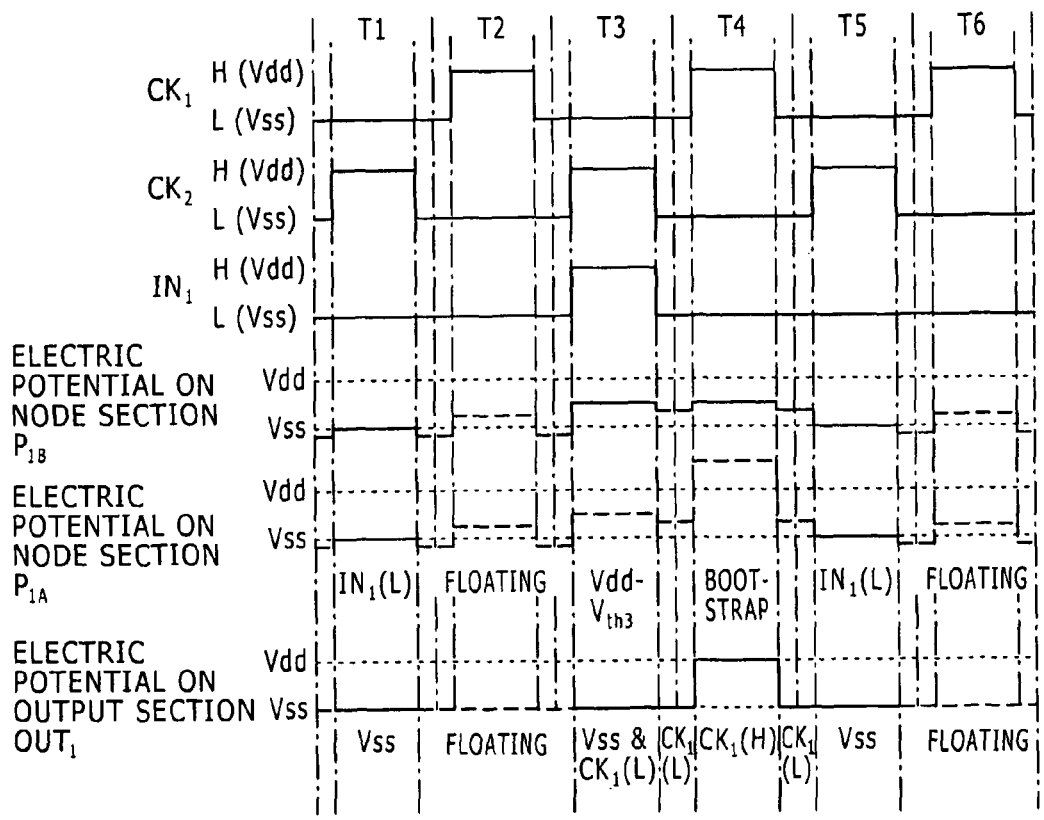
FIG. 7B is a timing diagram showing a model of timing charts of signals relevant to operations carried out by the bootstrap circuit including parasitic capacitors implemented by the second embodiment to serve as a bootstrap circuit at the first stage of the scan circuit.

FIG. 7A is a circuit diagram showing a typical configuration of a bootstrap circuit implemented by the second embodiment to serve as a bootstrap circuit at the first stage of the scan circuit 101 whereas FIG. 7B is a timing diagram showing a model of timing charts of signals relevant to operations carried out by the bootstrap circuit implemented by the second embodiment to serve as a bootstrap circuit at the first stage of the scan circuit 101 taking parasitic capacitors into consideration.

In comparison with the bootstrap circuit provided in accordance with the first embodiment, the bootstrap circuit provided in accordance with the second embodiment employs a fourth transistor $Tr_{24}$ having the same conduction type as the first transistor $Tr_1$ to the third transistor $Tr_3$ (that is the n-channel type in the second embodiment). In this bootstrap circuit provided in accordance with the second embodiment:

(D-1) a specific one of the source and drain areas of the fourth transistor $Tr_{24}$ is connected by a junction point to the gate electrode of the first transistor $Tr_1$;

(D-2) the other one of the source and drain areas of the fourth transistor $Tr_{24}$ is connected by another junction point to the specific one of the source and drain areas of the third transistor $Tr_3$; and (D-3) the gate electrode of the fourth transistor $Tr_{24}$ is a connected to a second voltage supply line $PS_2$ employed in the embodiment conveying a second predetermined voltage $V_{dd}$.

In the case of the configuration described above, the voltage-variation repression capacitor $C_{11}$ can be provided between the first voltage supply line $PS_1$ and the other junction point connecting the other one of the source and drain areas of the fourth transistor $Tr_{24}$ to the specific one of the source and drain areas of the third transistor $Tr_3$. The remaining configuration of the bootstrap circuit provided in accordance with the second embodiment is identical with that of the first embodiment.

In the bootstrap circuit provided in accordance with the second embodiment, the fourth transistor $Tr_{24}$ splits the node section $P_1$ included in the first embodiment explained earlier by referring to the circuit diagram of FIG. 4A into a first sub-node section $P_{1A}$ and a second sub-node section $P_{1B}$. The first sub-node section $P_{1A}$ is a portion close to the gate electrode of the first transistor $Tr_1$ whereas the second sub-node section $P_{1B}$ is a portion close to the specific one of the source and drain areas of the third transistor $Tr_3$. That is to say, the first sub-node section $P_{1A}$ is the junction point connecting the specific one of the source and drain areas of the fourth transistor $Tr_{24}$ to the gate electrode of the first transistor $Tr_1$ whereas the second sub-node section $P_{1B}$ is the other junction point connecting the other one of the source and drain areas of the fourth transistor $Tr_{24}$ is connected to the specific one of the source and drain areas of the third transistor $Tr_3$. It is to be noted that reference notation $C_{24}$ denotes a parasitic capacitor between the gate electrode of the fourth transistor $Tr_{24}$ and the specific one of the source and drain areas of the fourth transistor $Tr_{24}$.

In the bootstrap circuit provided in accordance with the second embodiment, when the fourth transistor $Tr_{24}$ is in a turned-on state, the voltage-variation repression capacitor $C_{11}$ is connected to the first sub-node section $P_{1A}$ so that the first sub-node section $P_{1A}$ and second sub-node section $P_{1B}$ are electro-statically coupled by the voltage-variation repression capacitor $C_{11}$ with the first voltage supply line $PS_1$ conveying the first voltage $V_{ss}$. By virtue of the capacitive coupling effect provided by the voltage-variation repression capacitor $C_{11}$ in this state, in the same way of the first embodiment, it is possible to repress variations of an electric potential appearing on each of the first sub-node section $P_{1A}$ and the second sub-node section $P_{1p}$, which compose the node section $P_1$ when the third transistor $Tr_3$ is put in a turned-off state. Thus, a rise caused by a rise of the first clock signal $CK_1$ as the rise of the electric potential appearing on each of the first sub-node section $P_{1A}$ and the second sub-node section $P_{1B}$ can be repressed in time periods $T_2$ and $T_5$ shown in the timing diagram of FIG. 7B.

In a time period $T_4$ shown in the timing diagram of FIG. 7B, on the other hand, the fourth transistor $Tr_{24}$ is in a turned-off state. That is to say, in a bootstrap operation, the voltage-variation repression capacitor $C_{11}$ is in a state of being electrically disconnected from the first sub-node section $P_{1A}$. Thus, a phenomenon observed in the first embodiment as the phenomenon of a decreased bootstrap gain does not occur in the second embodiment. As a result, it is possible to provide a bootstrap gain higher than that of the first embodiment. The bootstrap gain $g_b$ of the bootstrap circuit provided in accordance with the second embodiment is expressed by Eq. (2) given below. In the following equation, reference notation $C_{Tr1}$ denotes the gate capacitance of the first transistor $Tr_1$.

$$g_b = (C_{Tr1} + C_a + C_1)/(C_{24} + C_{Tr1} + C_a + C_1) \qquad (2)$$

Third Embodiment

A third embodiment implements a bootstrap circuit provided in accordance with the second mode of the present invention. As described above, the scan circuit 101 employs the bootstrap circuit provided in accordance with the third embodiment at every stage. The following description explains only the configuration of the bootstrap circuit provided at the first stage to serve as the bootstrap circuit provided in accordance with the third embodiment and operations carried out by this the bootstrap circuit.

FIG. 8A is a circuit diagram showing a typical configuration of the bootstrap circuit implemented by the third embodiment to serve as a bootstrap circuit at the first stage of the scan circuit 101 whereas FIG. 8B is a timing diagram showing a model of timing charts of signals relevant to operations carried out by the bootstrap circuit implemented by the third embodiment to serve as a bootstrap circuit at the first stage of the scan circuit 101. It is to be noted that the timing charts show the two clock signals $CK_1$ and $CK_2$ which have phases opposite to each other and change the phases synchronously.

In the same way as the bootstrap circuit provided in accordance with the first embodiment described earlier, the bootstrap circuit provided in accordance with the third embodiment employs the first transistor $Tr_1$, the second transistor $Tr_2$ and the third transistor $Tr_3$ which have the same conduction type. Also in the case of the third embodiment, the conduction type is the n-channel conduction type.

In the same way as the bootstrap circuit provided in accordance with the first embodiment of the present invention, in the bootstrap circuit provided in accordance with the third embodiment:

(A-1) a specific one of the source and drain areas of the first transistor $Tr_1$ and a specific one of the source and drain areas of the second transistor $Tr_2$ are connected to each other by an output section $OUT_1$ of the bootstrap circuit;

(A-2) the other one of the source and drain areas of the first transistor $Tr_1$ is connected to a clock supply line which conveys a specific one of two clock signals $CK_1$ and $CK_2$ having phases different from each other (in the case of the bootstrap circuit provided in accordance with the third embodiment of the present invention, the specific one of two clock signals $CK_1$ and $CK_2$ is the clock signal $CK_1$ as shown in the circuit diagram of FIG. 8A);

(A-3) the gate electrode of the first transistor $Tr_1$ and a specific one of the source and drain areas of the third transistor $Tr_3$ are connected to each other by a node section $P_1$;

(B-1) the other one of the source and drain areas of the second transistor $Tr_2$ is connected to a first voltage supply line $PS_1$ conveying a first predetermined voltage $V_{Ss}$ which is set at a typical electric potential of 0 V;

(C-1) the other one of the source and drain areas of the third transistor $Tr_3$ is connected to a signal supply line which conveys an input signal $IN_1$ supplied to the bootstrap circuit;

(C-2) the gate electrode of the third transistor $Tr_3$ is connected to a clock supply line which conveys the other one of the two clock signals $CK_1$ and $CK_2$ (in the case of the bootstrap circuit provided in accordance with the third embodiment of the present invention, the other one of the two clock signals $CK_1$ and $CK_2$ is the clock signal $CK_2$ as shown in the circuit diagram of FIG. 8A); and the node section $P_1$ connecting the gate electrode of the first transistor $Tr_1$ and the specific one of the source and drain areas of the third transistor $Tr_3$ to each other is put in a floating state when the third transistor $Tr_3$ is put in a turned-off state.

In addition, the gate electrode of the second transistor $Tr_2$ is connected to the clock supply line which conveys the other one of the two clock signals $CK_1$ and $CK_2$ having phases different from each other. (In the case of the bootstrap circuit provided in accordance with the third embodiment of the present invention, the other one of two clock signals $CK_1$ and $CK_2$ is the clock signal $CK_2$ as shown in the circuit diagram of FIG. 8A). On top of that, in place of the voltage-variation repression capacitor $C_{11}$ wired between the node section $P_1$ and the first voltage supply line $PS_1$ as shown in the circuit diagram of FIG. 1, a voltage-variation repression capacitor $C_{31}$ is connected between the node section $P_1$ and the gate electrode of the second transistor $Tr_2$.

In the bootstrap circuit provided in accordance with the third embodiment, the capacitance of the voltage-variation repression capacitor $C_{31}$ is set at such a value that abrupt level changes of the first clock signal $CK_1$ and abrupt level changes of the second clock signal $CK_2$ cancel each other. That is to say, variations of the electric potential appearing on the node section $P_1$ are reduced during the time periods $T_2$ and $T_6$ as shown in the timing diagram of FIG. 8B.

The bootstrap circuit provided in accordance with the third embodiment is explained concretely as follows. Abrupt level changes of the first clock signal $CK_1$ arrive at the node section $P_1$ by way of a parasitic capacitor $C_1$. In addition, abrupt level changes of the second clock signal $CK_2$ arrive at the node section $P_1$ by way of not only a parasitic capacitor $C_3$, but also a parasitic capacitor $C_2$ and a bootstrap capacitor $C_a$ used for bootstrap operations.

Through the subsequent stages of the scan circuit 101, the output section $OUT_1$ is eventually connected to a load such as a scan line SCL having a large capacitance. Thus, the first transistor $Tr_1$ is generally designed as a transistor having a large size such as a W (width) of 100 and an L (length) of 10. On the other hand, it is necessary to repress a leak current flowing through the third transistor $Tr_3$ in order to allow the bootstrap operation to be carried out well. Thus, the third transistor $Tr_3$ is generally designed as a transistor having a small size such as a W of 5 and an L of 10. The second transistor $Tr_2$ is a supplementary transistor for sustaining the low level which is the level of the first voltage $V_{ss}$. Thus, it is not necessary to design the second transistor $Tr_2$ into a transistor having a large size. For example, the size of the second transistor $Tr_2$ is set at a W of 10 and an L of 10.

Let reference notation $C_{SEL}$ denotes the capacitance of the eventual load connected to the output section $OUT_1$. The load capacitance $C_{SEL}$ is extremely large in comparison with the parasitic capacitor $C_2$. Thus, some abrupt level changes originated from the second clock signal $CK_2$ as abrupt level changes propagating to the node section $P_1$ by way of the parasitic capacitor $C_2$ and the bootstrap capacitor $C_a$ used for the bootstrap operation almost do not have an effect on the electric potential appearing on the node section $P_1$. For this reason, when taking the abrupt level changes of the second clock signal $CK_2$ into consideration, the abrupt level changes propagating to the node section $P_1$ by way of the parasitic capacitor $C_2$ and the bootstrap capacitor $C_a$ used for the bootstrap operation can be ignored.

As described above, abrupt level changes of the first clock signal $CK_1$ arrive at the node section $P_1$ by way of the parasitic capacitor $C_1$. In addition, abrupt level changes of the second clock signal $CK_2$ arrive at the node section $P_1$ by way of the parasitic capacitor $C_3$. Since the two clock signals $CK_1$ and $CK_2$ have phases opposite to each other, the abrupt level changes originated from the first clock signal $CK_1$ as abrupt level changes propagating to the node section $P_1$ by way of the parasitic capacitor $C_1$ change the electric potential appearing on the node section $P_1$ in a direction opposite to the direction in which the abrupt level changes originated from the second clock signal $CK_2$ as abrupt level changes propagating to the node section $P_1$ by way of the parasitic capacitor $C_3$ change the electric potential appearing on the node section $P_1$. Thus, if the capacitance of the parasitic capacitor $C_1$ is equal to the capacitance of the parasitic capacitor $C_3$, the effect of the abrupt level changes of the first clock signal $CK_1$ and the effect of the abrupt level changes of the second clock signal $CK_2$ cancel each other.

Since the size of the first transistor $Tr_1$ is different from the size of the third transistor $Tr_3$ as described above, however, the capacitance of the parasitic capacitor $C_1$ is normally greater than the capacitance of the parasitic capacitor $C_3$. Thus, the effect of the abrupt level changes of the first clock signal $CK_1$ is different from the effect of the abrupt level changes of the second clock signal $CK_2$. As a result, the electric potential appearing on the node section $P_1$ varies.

In order to solve the problem described above, the bootstrap circuit according to the third embodiment is provided with the voltage-variation repression capacitor $C_{31}$ connected between the gate electrodes of the second transistor $Tr_2$ and the third transistor $Tr_3$ in parallel to the parasitic capacitor $C_3$ in order to reduce variations which are caused by the difference between the effect of the abrupt level changes of the first clock signal $CK_1$ and the effect of the abrupt level changes of the second clock signal $CK_2$ as variations of the electric potential appearing on the node section $P_1$. The capacitance of the voltage-variation repression capacitor $C_{31}$ is properly determined in accordance with the design of the bootstrap circuit. Typically, the capacitance of the voltage-variation repression capacitor $C_{31}$ is determined by measuring the variations of the electric potential appearing on the node section $P_1$.

Fourth Embodiment

A fourth embodiment implements a bootstrap circuit provided in accordance with the third mode of the present invention. As described above, the scan circuit 101 employs the bootstrap circuit provided in accordance with the fourth embodiment at every stage. The following description explains only the configuration of the bootstrap circuit provided at the first stage to serve as the bootstrap circuit provided in accordance with the third fourth and operations carried out by this the bootstrap circuit.

Figure 9:
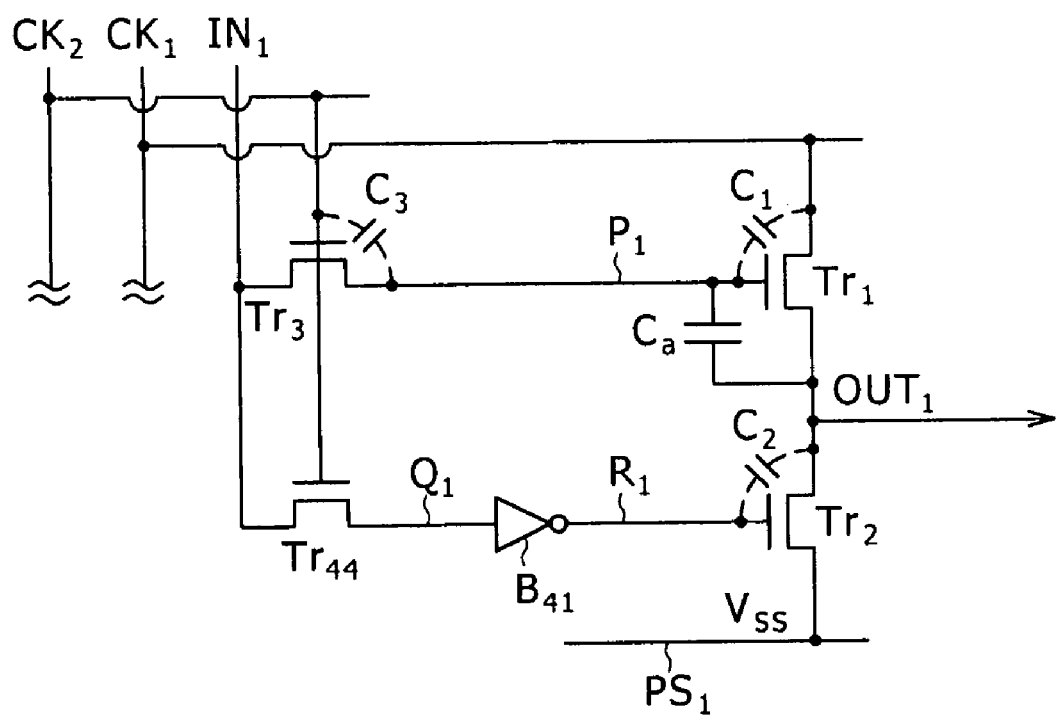
FIG. 9 is a circuit diagram showing a typical configuration of a bootstrap circuit implemented by a fourth embodiment of the present invention to serve as a bootstrap circuit at the first stage of the scan circuit.

FIG. 9 is a circuit diagram showing a typical configuration of the bootstrap circuit implemented by the fourth embodiment to serve as a bootstrap circuit at the first stage of the scan circuit 101. In the same way as the bootstrap circuit provided in accordance with the first embodiment described earlier, the bootstrap circuit provided in accordance with the fourth embodiment employs the first transistor $Tr_1$, the second transistor $Tr_2$ and the third transistor $Tr_1$ which have the same conduction type. Also in the case of the fourth embodiment, the conduction type is the n-channel conduction type.

In the same way as the bootstrap circuit provided in accordance with the first embodiment of the present invention, in the bootstrap circuit provided in accordance with the fourth embodiment:

(A-1) a specific one of the source and drain areas of the first transistor $Tr_1$ and a specific one of the source and drain areas of the second transistor $Tr_2$ are connected to each other by an output section $OUT_1$ of the bootstrap circuit;

(A-2) the other one of the source and drain areas of the first transistor $Tr_1$ is connected to a clock supply line which conveys a specific one of two clock signals $CK_1$ and $CK_2$ having phases different from each other (in the case of the bootstrap circuit provided in accordance with the fourth embodiment of the present invention, the specific one of two clock signals $CK_1$ and $CK_2$ is the clock signal $CK_1$ as shown in the circuit diagram of FIG. 9);

(A-3) the gate electrode of the first transistor $Tr_1$ and a specific one of the source and drain areas of the third transistor $Tr_3$ are connected to each other by a node section $P_1$;

(B-1) the other one of the source and drain areas of the second transistor $Tr_2$ is connected to a first voltage supply line $PS_1$ conveying a first predetermined voltage $V_{SS}$ which is set at a typical electric potential of 0 V;

(C-1) the other one of the source and drain areas of the third transistor $Tr_3$ is connected to a signal supply line which conveys an input signal $IN_1$ supplied to the bootstrap circuit;

(C-2) the gate electrode of the third transistor $Tr_3$ is connected to a clock supply line which conveys the other one of the two clock signals $CK_1$ and $CK_2$ (in the case of the bootstrap circuit provided in accordance with the fourth embodiment of the present invention, the other one of the two clock signals $CK_1$ and $CK_2$ is the clock signal $CK_2$ as shown in the circuit diagram of FIG. 9); and the node section $P_1$ connecting the gate electrode of the first transistor $Tr_1$ and the specific one of the source and drain areas of the third transistor $Tr_3$ to each other is put in a floating state when the third transistor $Tr_3$ is put in a turned-off state.

The bootstrap circuit provided in accordance with the fourth embodiment of the present invention is also provided with a fourth transistor $Tr_{44}$ having the same conduction type as the first to third transistors and, in the bootstrap circuit:

(E-1) a specific one of the source and drain areas of the fourth transistor $Tr_{44}$ is connected by an input-side junction point to the input side of an inverter circuit $B_{41}$, the output side of which is connected by an output-side to the gate electrode of the second transistor $Tr_2$;

(E-2) the other one of the source and drain areas of the fourth transistor $Tr_{44}$ is connected to the input supply line; and (E-3) the gate electrode of the fourth transistor $Tr_{44}$ is connected to the clock supply line which conveys the other one of the two clock signals (in the case of the bootstrap circuit provided in accordance with the fourth embodiment of the present invention, the other one of the two clock signals $CK_1$ and $CK_2$ is the clock signal $CK_2$ as shown in the circuit diagram of FIG. 9).

As shown in the circuit diagram of FIG. 9, the input-side junction point connecting the specific one of the source and drain areas of the fourth transistor $Tr_{44}$ to the input side of the inverter circuit $B_{41}$ is referred to as a node section $Q_1$ whereas an output-side junction point connecting the output side of the inverter circuit $B_{41}$ to the gate electrode of the second transistor $Tr_2$ is referred to as a node section $R_1$.

Figure 10A:
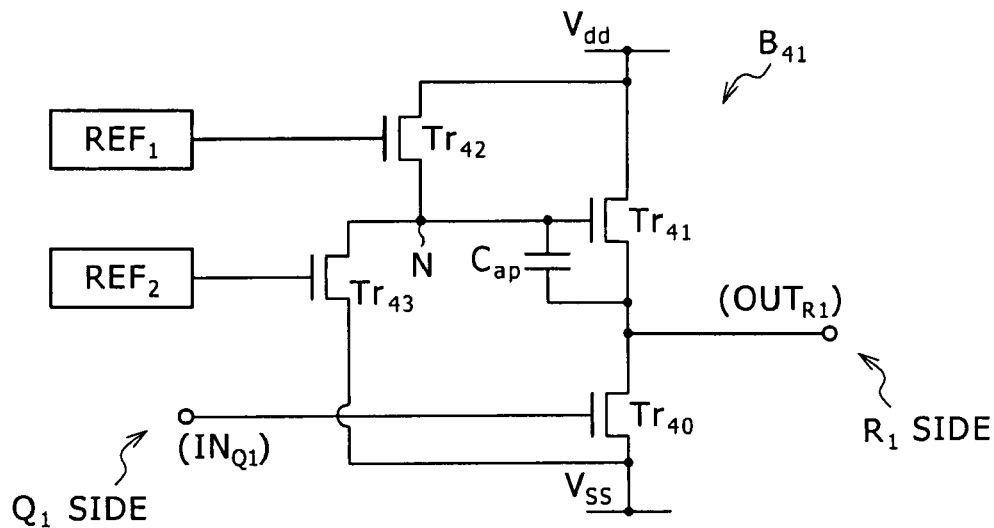
FIG. 10A is a circuit diagram showing a typical configuration of an inverter circuit.
Figure 10B:
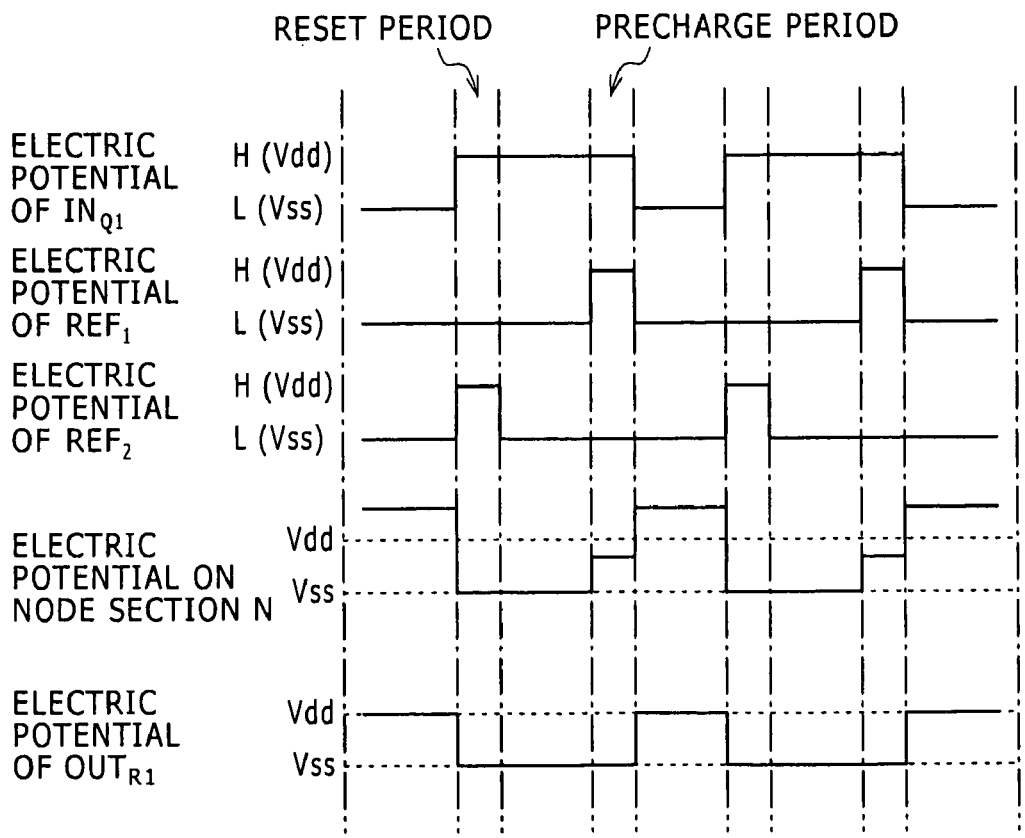
FIG. 10B is a timing diagram showing a model of timing charts of signals relevant to operations carried out by the inverter circuit.

FIG. 10A is a circuit diagram showing a typical configuration of the inverter circuit $B_{41}$ whereas FIG. 10B is a timing diagram showing a model of timing charts of signals relevant to operations carried out by the inverter circuit $B_{41}$. First of all, the following description explains the configuration of the inverter circuit $B_{41}$ and operations carried out by the inverter circuit $B_{41}$.

The configuration shown in the circuit diagram of FIG. 10A as the configuration of the inverter circuit $B_{41}$ is identical with a configuration shown in FIG. 5 of Japanese Patent Laid-open No. 2005-143068. It is to be noted, however, that reference notations and reference numerals in the circuit diagram of FIG. 10A are different from those used in FIG. 5 of Japanese Patent Laid-open No. 2005-143068.

As shown in the circuit diagram of FIG. 10A, the inverter circuit $B_{41}$ employs four inverter transistors which are each created as a transistor of the n-channel type, i.e., inverter transistors $Tr_{40}$, $Tr_{41}$, $Tr_{41}$ and $Tr_{43}$, as well as a bootstrap capacitor $C_{ap}$. Created on a substrate not shown in the diagram of FIG. 10A, each of the inverter transistors $Tr_{40}$, $Tr_{41}$, $Tr_{42}$ and $Tr_{43}$ is also an n-channel TFT (Thin Film Transistor) having source and drain areas, a channel creation area as well as a gate electrode. In the same way as the capacitors such as the voltage-variation repression capacitor $C_{11}$ and the bootstrap capacitor $C_a$ which are employed in the first embodiment, the bootstrap capacitor $C_{ap}$ is also configured to employ two conductive layers and an insulation layer sandwiched by the two conductive layers.

A specific one of the source and drain areas of the inverter transistor $Tr_{40}$ is connected to a specific one of the source and drain areas of the inverter transistor $Tr_{41}$. The other one of the source and drain areas of the inverter transistor $Tr_{40}$ is connected to the first voltage supply line that conveys the first voltage $V_{ss}$. The gate electrode of the inverter transistor $Tr_{40}$ is connected to the node section $Q_1$ included in the bootstrap circuit shown in the circuit diagram of FIG. 9 to serve as a node section supplying an input signal $IN_{Q1}$ to the inverter circuit $B_{41}$. A junction point connecting the specific one of the source and drain areas of the inverter transistor $Tr_{40}$ to the specific one of the source and drain areas of the inverter transistor $Tr_{41}$ outputs an inverted output signal $OUT_{R1}$ to the node section $R_1$ of the bootstrap circuit shown in the circuit diagram of FIG. 9. The other one of the source and drain areas of the inverter transistor $Tr_{41}$ serving as a resistive load of the inverter transistor $Tr_{40}$ is connected to the second voltage supply line which conveys the second voltage $V_{dd}$.

The bootstrap capacitor $C_{ap}$ is connected between the gate electrode of the inverter transistor $Tr_{41}$ and the specific one of the source and drain areas of the inverter transistor $Tr_{41}$, forming a bootstrap circuit in conjunction with the inverter transistor $Tr_{41}$. A specific one of the source and drain areas of the inverter transistor $Tr_{42}$ is connected to the gate electrode of the inverter transistor $Tr_{41}$ whereas the other one of the source and drain areas of the inverter transistor $Tr_{42}$ is connected to the second voltage supply line which conveys the second voltage $V_{dd}$. The gate electrode of the inverter transistor $Tr_{42}$ is connected to a reference signal line which conveys a first reference signal $REF_1$. A junction point connecting the specific one of the source and drain areas of the inverter transistor $Tr_{42}$ to the gate electrode of the inverter transistor $Tr_{41}$ serves as a node section N. A specific one of the source and drain areas of the inverter transistor $Tr_{43}$ is connected to the node section N whereas the other one of the source and drain areas of the inverter transistor $Tr_{43}$ is connected to the first voltage supply line which conveys the first voltage $V_{ss}$. The gate electrode of the inverter transistor $Tr_{43}$ is connected to a reference signal line which conveys a second reference signal $REF_2$.

The timing diagram of FIG. 10B shows timing charts of the input signal $IN_{Q1}$ supplied to the inverter circuit $B_{41}$, the first reference signal $REF_1$, the second reference signal $REF_2$, the electric potential appearing on the node section N and the output signal $OUT_{R1}$ generated by the inverter circuit $B_{41}$. The input signal $IN_{Q1}$ supplied to the inverter circuit $B_{41}$ is a signal coming from the node section $Q_1$ whereas the output signal $OUT_{R1}$ generated by the inverter circuit $B_{41}$ is a signal supplied to the node section $R_1$. The timing chart of a signal shows a relation between the level of the signal and the timing of the level. Before the level of the input signal $IN_{Q1}$ changes from the high level of the second voltage $V_{dd}$ to the low level of the first voltage $V_{ss}$ or, in other words, during a fixed time period immediately leading ahead of the end of the high level of the input signal $IN_{Q1}$, the first reference signal $REF_1$ is at a high level. After the level of the input signal $IN_{Q1}$ changes from the low level to the high level. On the other hand, the second reference signal $REF_2$ is at a high level for the fixed time period immediately lagging behind the rising edge of the input signal $IN_{Q1}$.

By providing the inverter circuit $B_{41}$ with the inverter transistor $Tr_{43}$ for resetting the electric potential appearing on the gate electrode of the inverter transistor $Tr_{41}$ to the low level when the input signal $IN_{Q1}$ changes from the low level to the high level, with the input signal $IN_{Q1}$ set at the high level, the inverter transistor $Tr_{41}$ can be put in a turned-off state completely, disallowing a penetration current to flow. It is to be noted that the electric potential appearing on the gate electrode of the inverter transistor $Tr_{41}$ is the electric potential appearing on the node section N. Thus, the electric potential appearing on the output signal $OUT_{R1}$ is not changed by the penetration current. As a result, the first voltage $V_{ss}$ can be obtained as the low level of the electric potential of the output signal $OUT_{R1}$.

In addition, by providing the inverter transistor $Tr_{42}$ for pre-charging the electric potential appearing on the gate electrode of the inverter transistor $Tr_{41}$ (that is the electric potential appearing on the node section N) to the high level before the input signal $IN_{Q1}$ changes from the high level to the low level, the electric potential appearing on the gate electrode of the inverter transistor $Tr_{41}$ is further raised from the pre-charge level set by the inverter transistor $Tr_{42}$ to an even higher level on the plus side when the level of the input signal $IN_{Q1}$ changes to the low level by virtue of the capacitive coupling effect provided by the bootstrap capacitor $C_{ap}$. As a result, the second voltage $V_{dd}$ can be obtained as the high level of the electric potential of the output signal $OUT_{R1}$.

Figure 11:
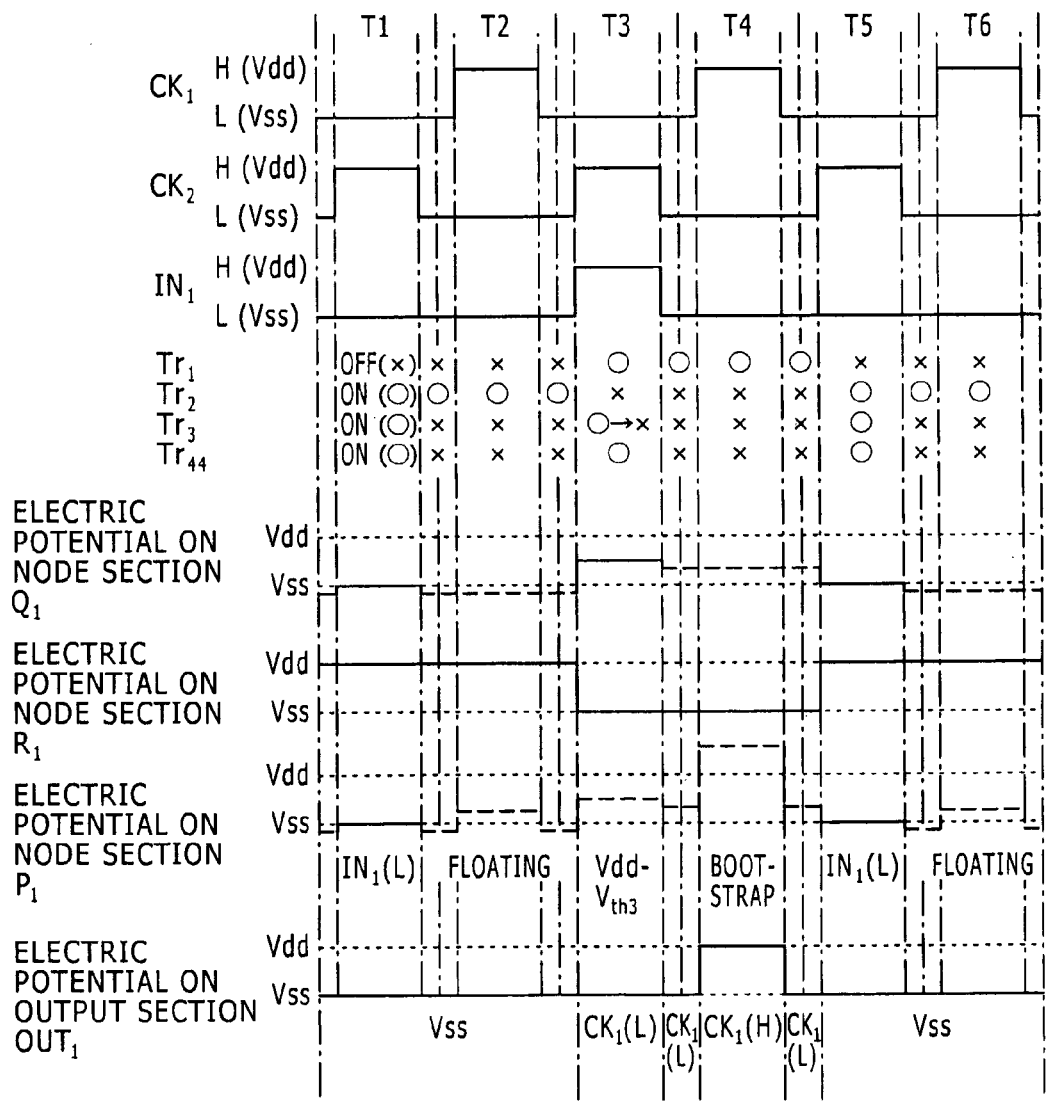
FIG. 11 is a timing diagram showing a model of timing charts of signals relevant to operations carried out by the bootstrap circuit shown in the circuit diagram of FIG. 9.

FIG. 11 is a timing diagram showing a model of timing charts of signals relevant to operations carried out by the bootstrap circuit shown in the circuit diagram of FIG. 9 to serve as a bootstrap circuit according to the fourth embodiment. In this bootstrap circuit provided in accordance with the fourth embodiment, due to the operations carried out by the inverter circuit $B_{41}$, during a period of time between the start of the time period $T_1$ and the rising edge of the input signal $IN_1$ in the time period $T_3$ as well as during a period of time between the rising edge of the second clock signal $CK_2$ in the time period $T_5$ and the end of the time period $T_6$, the electric potential appearing on the node section $R_1$ is sustained at the high level. During these periods of time, the first voltage $V_{ss}$ is supplied to the output section $OUT_1$ by way of the second transistor $Tr_2$ which is in a turned-on state. In addition, during a specific period of time in the time period $T_3$, the first clock signal $CK_1$ at the low level is supplied to the output section $OUT_1$. The specific period of time in the time period $T_3$ is a period of time during which each of the second clock signal $CK_2$ and the input signal $IN_1$ is at a high level. On top of that, also during a period of time between the falling edge of the first clock signal $CK_1$ in the time period $T_4$ and the rising edge of the second clock signal $CK_2$ in the time period $T_5$, the first clock signal $CK_1$ at the low level is supplied to the output section $OUT_1$.

Thus, in the bootstrap circuit provided in accordance with the fourth embodiment, the first voltage $V_{ss}$ or the first clock signal $CK_1$ at the low level is supplied to the output section $OUT_1$ as the low level of the electric potential appearing on the output section $OUT_1$, preventing the output section $OUT_1$ from entering a floating state. As a result, the electric potential appearing on the output section $OUT_1$ does not vary due to abrupt level changes arriving through the bootstrap capacitor $C_a$ and/or the parasitic capacitor $C_2$. That is to say, effects of the abrupt level changes can be reduced.

Figure 12A:
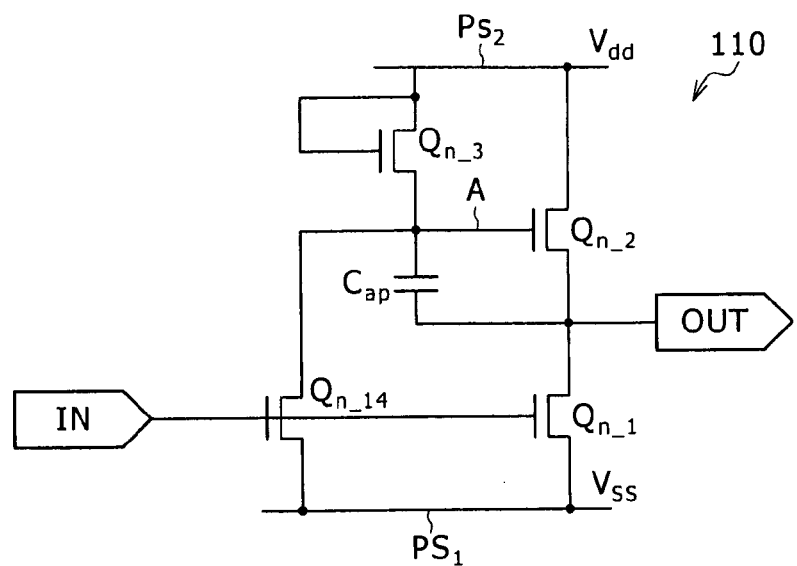
FIG. 12A is a circuit diagram showing a typical configuration of an inverter circuit.
Figure 12B:
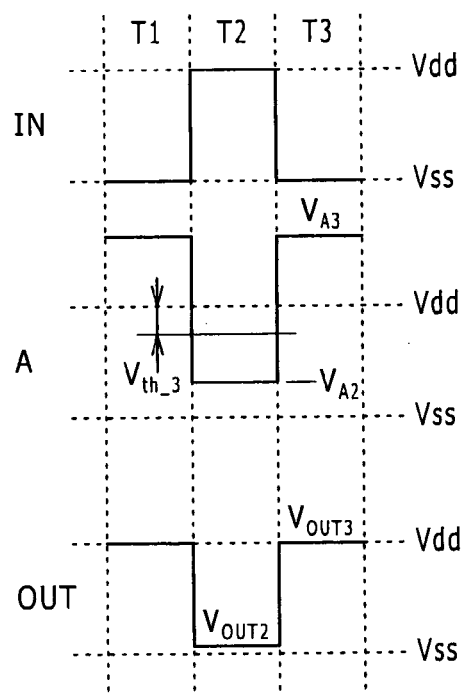
Figure 12B:
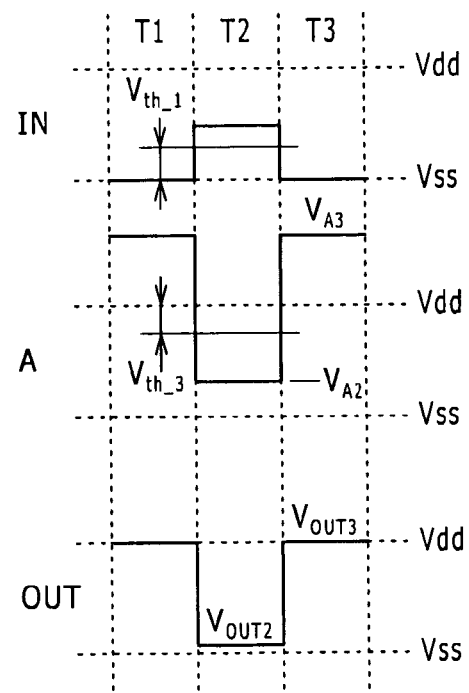

In addition, it is also possible to provide a configuration making use of any one of a variety of inverter circuits proposed by the inventors of the present invention in Japanese Patent Application Nos. 2008-26742 and 2008-26743 as the inverter circuit $B_{41}$. FIG. 12A is a circuit diagram showing a typical configuration of an inverter circuit 110 whereas each of FIGS. 12B and 12C is a timing diagram showing a model of timing charts of signals relevant to other operations carried out by the inverter circuit 110 shown in the circuit diagram of FIG. 12A.

First of all, the configuration of the inverter circuit 110 is explained by referring to the circuit diagram of FIG. 12A as follows. The inverter circuit 110 is configured to employ inverter transistors $Q_{n\_1}$, $Q_{n\_2}$ and $Q_{n\_3}$ having the same conduction type such as the n-channel conduction type. In the inverter circuit 110:

(A-1) a specific one of the source and drain areas of the transistor $Q_{n\_1}$ and a specific one of the source and drain areas of the transistor $Q_{n\_2}$ are connected to each other by an output section OUT of the inverter circuit 110;

(B-1) the other one of the source and drain areas of the transistor $Q_{n\_2}$ is connected to the second voltage supply line $PS_2$;

(B-2) the gate electrode of the inverter transistor $Q_{n\_2}$ is connected to a specific one of the source and drain areas of the inverter transistor $Q_{n\_3}$; and (C-1) the gate electrode of the inverter transistor $Q_{n\_3}$ is connected to the other one of the source and drain areas of the inverter transistor $Q_{n\_3}$.

The inverter circuit 110 further employs an inverter transistor $Q_{n\_14}$ which has the same conduction type as that of the inverter transistors $Q_{n\_1}$, $Q_{n\_2}$ and $Q_{n\_3}$. The other one of the source and drain areas of the transistor $Q_{n\_3}$ is also connected to the second voltage supply line $PS_2$. A node section A connecting the gate electrode of the inverter transistor $Q_{n\_2}$ to the specific one of the source and drain areas of the inverter transistor $Q_{n\_3}$ is wired to a specific one of the source and drain areas of the inverter transistor $Q_{n\_14}$. The other one of the source and drain areas of the inverter transistor $Q_{n\_1}$ and the other one of the source and drain areas of the inverter transistor $Q_{n\_14}$ are both connected to the first voltage supply line $PS_1$. The gate electrodes of the inverter transistor $Qhd n\_1$ and the inverter transistor $Q_{n\_14}$ are connected to a line which conveys an input signal IN supplied to the inverter circuit 110.

Each of the inverter transistors $Q_{n\_1}$, $Q_{n\_2}$, $Q_{n\_3}$ and $Q_{\_14}$ employed in the inverter circuit 110 is also an n-channel TFT (Thin Film Transistor) having source and drain areas, a channel creation area as well as a gate electrode. These inverter transistors are created on a substrate which is not shown in the circuit diagram of FIG. 12A.

It is to be noted that a capacitor $C_{ap}$ serving as a bootstrap capacitor is connected between the gate electrode of the inverter transistor $Q_{n\_2}$ and the specific one of the source and drain areas of the inverter transistor $Q_{n\_2}$. For example, the bootstrap capacitor $C_{ap}$ is configured to employ two conductive layers and an insulation layer sandwiched by the two conductive layers. The bootstrap capacitor $C_{ap}$ is also created on the substrate which is not shown in the circuit diagram of FIG. 12A.

The second voltage supply line $PS_2$ conveys the second voltage $V_{dd}$ having a high level determined in advance whereas the first voltage supply line $PS_1$ conveys the first voltage $V_{ss}$ having a low level determined in advance. The input signal IN is supplied to the gate electrode of the inverter transistor $Q_{n\_1}$. In the following description of the inverter circuit 110, the low level of the input signal IN is assumed to be the level of the first voltage $V_{ss}$ whereas the high level of the input signal IN is assumed to be the level of the second voltage $V_{dd}$.

When the input signal IN is supplied to the inverter circuit 110, each of the inverter transistor $Q_{n\_1}$ and the inverter transistor $Q_{n\_14}$ is turned on. Thus, during a time period $T_2$ shown in the timing diagram of FIG. 12B, an electric potential $V_{A2}$ appearing on the node section A is at a level which is between the first voltage $V_{ss}$ asserted on the first voltage supply line $PS_1$ and a level of $(V_{dd}-V_{th3})$ and close to the first voltage $V_{ss}$. A low level $V_{OUT2}$ of the output signal OUT generated by the inverter circuit 110 during the time period $T_2$ is determined by partial pressure ratio composed of the turned-on resistance of the inverter transistor $Q_{n\_1}$ and the turned-off resistance of the inverter transistor $Q_{n\_2}$ put in a turned-off state by the electric potential $V_{A2}$, which appears on the node section A connected to the gate electrode of the inverter transistor $Q_{n\_2}$ as a electric potential lower than the level of $(V_{dd}-V_{th3})$, to serve as a potentiometer connected between the first voltage supply line $PS_1$ and the second voltage supply line $PS_2$. Thus, the low level $V_{OUT2}$ of the output signal OUT during the time period $T_2$ is even closer to the first voltage $V_{ss}$. During a time period $T_3$, on the other hand, the same bootstrap operation as the bootstrap operation described earlier in the paragraph with a title of "Description of the Related Art" takes place, causing an electric potential $V_{A3}$ appearing on the node section A to exceed the second voltage $V_{dd}$ which is a voltage set at the high level. If a difference of $(V_{A3}-V_{dd})$ is set at a value greater than the threshold voltage $V_{th\_2}$ of the inverter transistor $Q_{n\_2}$, a high level $V_{OUT3}$ of the output signal OUT of the inverter circuit 110 during the time period $T_3$ attains the second voltage $V_{dd}$ which is a voltage set at the perfect high level.

It is to be noted that, in the inverter circuit 110, the input signal IN serves as a gate-source voltage $V_{gs}$ applied between the gate and source electrodes of the inverter transistor $Q_{n\_1}$. Even if the high level of the input signal IN does not attain the second voltage $V_{dd}$, the inverter circuit 110 operates. To put it concretely, if the level of the input signal IN is higher than the threshold voltage $V_{th\_1}$ of the inverter transistor $Q_{n\_1}$ during the time period $T_2$ as shown in the timing diagram of FIG. 12C, the voltage of the output signal OUT of the inverter circuit 110 changes from a high level to a low level. Thus, the inverter circuit 110 also functions as a level shifter.

Fifth Embodiment

A fifth embodiment is obtained by modifying the fourth embodiment. Much like the descriptions given so far to serve as the descriptions of the first to fourth embodiments, the following description explains the configuration of a bootstrap circuit implemented in accordance with the fifth embodiment to serve as a bootstrap circuit provided at the first stage of the scan circuit 101 and operations carried out by the bootstrap circuit.

Figure 13:
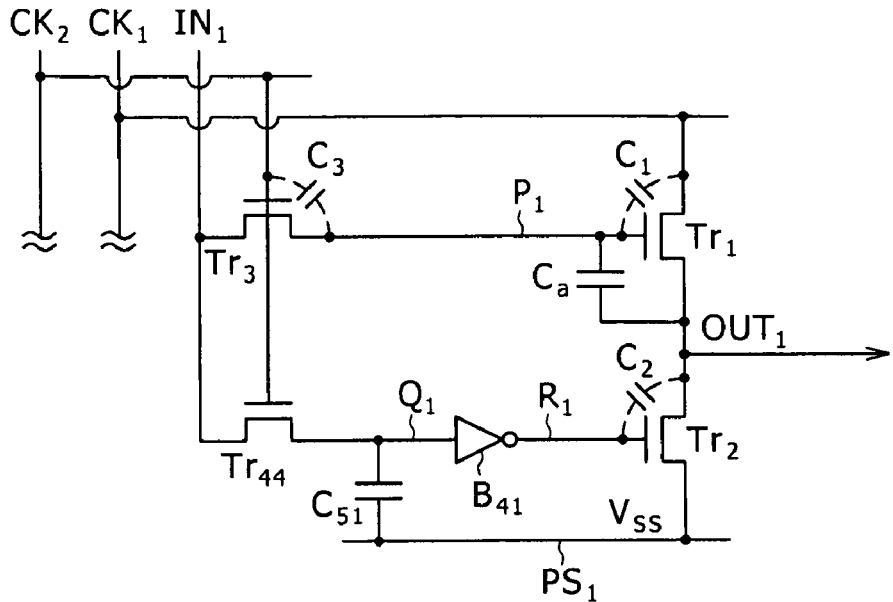
FIG. 13 is a circuit diagram showing a typical configuration of a bootstrap circuit implemented in accordance with a fifth embodiment to serve as a bootstrap circuit provided at the first stage of the scan circuit.

FIG. 13 is a circuit diagram showing a typical configuration of a bootstrap circuit implemented in accordance with the fifth embodiment to serve as a bootstrap circuit provided at the first stage of the scan circuit 101. The configuration of the bootstrap circuit implemented in accordance with the fifth embodiment as shown in the circuit diagram of FIG. 13 is basically identical with the configuration of the bootstrap circuit implemented in accordance with the fourth embodiment as shown in the circuit diagram of FIG. 9 except that, in the case of the bootstrap circuit according to the fifth embodiment, a voltage-variation repression capacitor $C_{51}$ is wired between the first voltage supply line $PS_1$ and a junction point connecting the specific one of the source and drain areas of the fourth transistor $Tr_{44}$ to the input side of the inverter circuit $B_{41}$.

Since operations carried out by the bootstrap circuit implemented in accordance with the fifth embodiment are identical with the operations carried out by the bootstrap circuit implemented in accordance with the fourth embodiment as described earlier by referring to the timing diagram of FIG. 11, description of the operations carried out by the bootstrap circuit according to the fifth embodiment is omitted in order to avoid duplications of descriptions. The voltage-variation repression capacitor $C_{51}$ functions as a capacitor for absorbing variations of the electric potential appearing on the node section Q. Thus, the operations carried out by the inverter circuit $B_{41}$ can be made more stable. As a result, the operations carried out by the bootstrap circuit can also be made more stable as well.

Sixth Embodiment

A sixth embodiment is also obtained by modifying the fourth embodiment. Much like the descriptions given so far to serve as the descriptions of the first to fifth embodiments, the following description explains the configuration of a bootstrap circuit implemented in accordance with the sixth embodiment to serve as a bootstrap circuit provided at the first stage of the scan circuit 101 and operations carried out by the bootstrap circuit.

Figure 14:
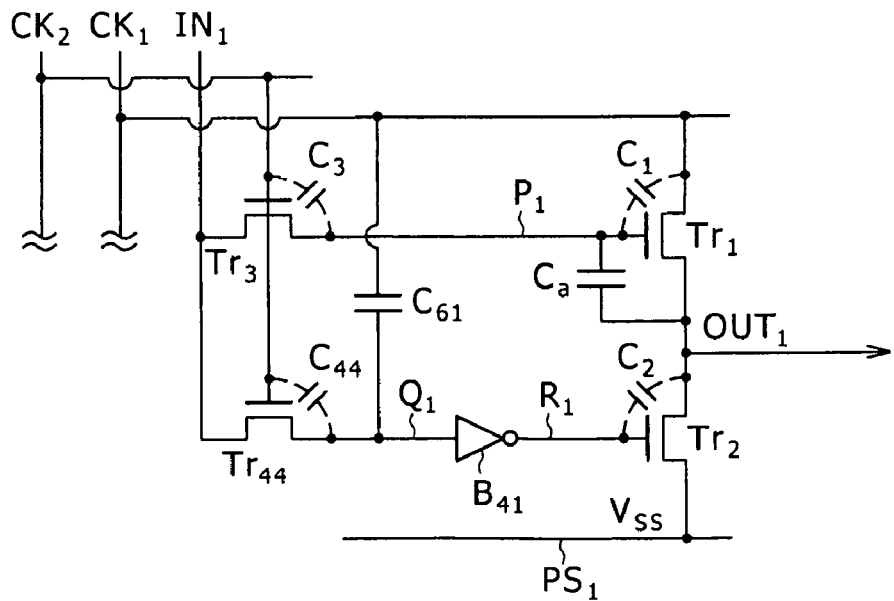
FIG. 14 is a circuit diagram showing a typical configuration of a bootstrap circuit implemented in accordance with a sixth embodiment to serve as a bootstrap circuit provided at the first stage of the scan circuit.

FIG. 14 is a circuit diagram showing a typical configuration of a bootstrap circuit implemented in accordance with the sixth embodiment to serve as a bootstrap circuit provided at the first stage of the scan circuit 101. The configuration of the bootstrap circuit implemented in accordance with the sixth embodiment as shown in the circuit diagram of FIG. 14 is basically identical with the configuration of the bootstrap circuit implemented in accordance with the fourth embodiment as shown in the circuit diagram of FIG. 9 except that, in the case of the bootstrap circuit according to the sixth embodiment, a bypass capacitor $C_{61}$ is wired between the other one of the source and drain areas of the first transistor $Tr_1$ and a junction point connecting the specific one of the source and drain areas of the fourth transistor $Tr_{44}$ to the input side of the inverter circuit $B_{41}$. It is to be noted that reference notation $C_{44}$ denotes a parasitic capacitor between the gate electrode of the fourth transistor $Tr_{44}$ and the specific one of the source and drain areas of the fourth transistor $Tr_{44}$.

Since operations carried out by the bootstrap circuit implemented in accordance with the sixth embodiment are identical with the operations carried out by the bootstrap circuit implemented in accordance with the fourth embodiment as described earlier by referring to the timing diagram of FIG. 11, description of the operations carried out by the bootstrap circuit according to the sixth embodiment is omitted in order to avoid duplications of descriptions. The bypass capacitor $C_{61}$ functions as a capacitor for decreasing a difference generated at the node section $Q_1$ as a difference between abrupt level changes of the clock signals $CK_1$ and $CK_2$. To put it more concretely, abrupt level changes of the clock signal $CK_2$ arriving at the node section $Q_1$ by way of a parasitic capacitor $C_{44}$ and abrupt level changes of the clock signal $CK_1$ arriving at the node section $Q_1$ by way of the bypass capacitor $C_{61}$ cancel each other. As a result, the operation carried out by the bootstrap circuit can be made more stable.

Seventh Embodiment

A seventh embodiment implements a bootstrap circuit provided in accordance with the fourth mode of the present invention. Much like the descriptions given so far to serve as the descriptions of the first to sixth embodiments, the following description explains the configuration of a bootstrap circuit implemented in accordance with the seventh embodiment to serve as a bootstrap circuit provided at the first stage of the scan circuit 101 and operations carried out by the bootstrap circuit.

Figure 15:
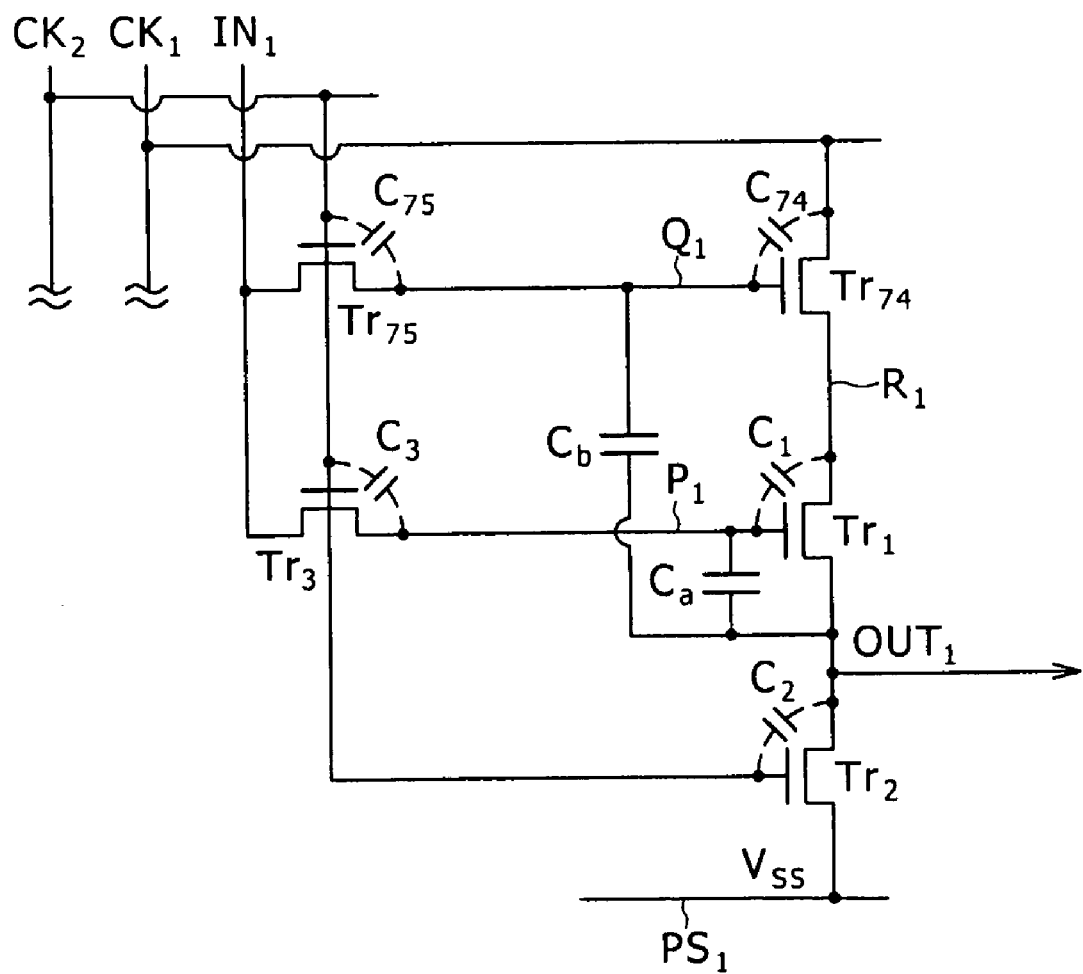
FIG. 15 is a circuit diagram showing a typical configuration of a bootstrap circuit implemented in accordance with a seventh embodiment to serve as a bootstrap circuit provided at the first stage of the scan circuit.
Figure 16:
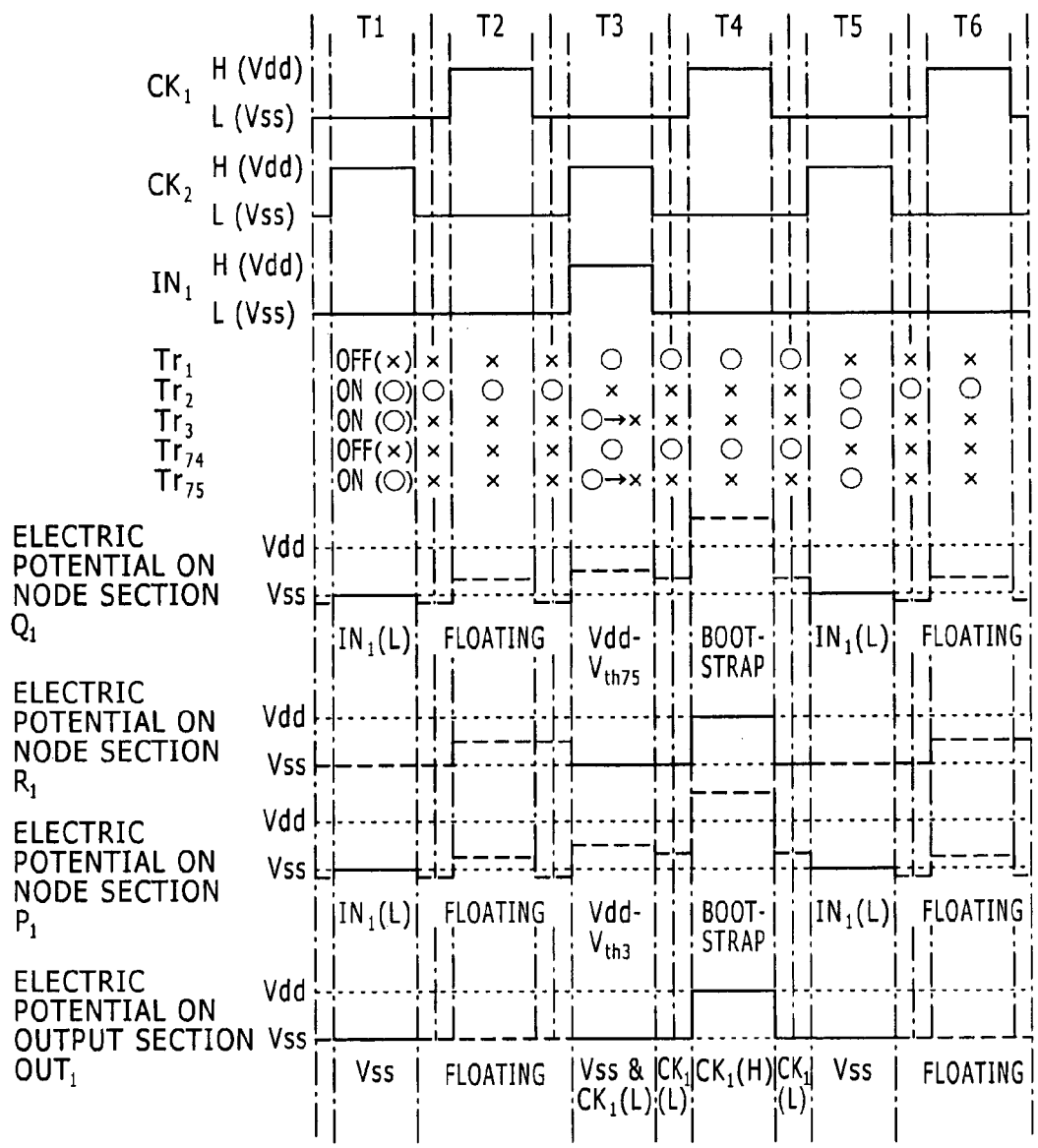
FIG. 16 is a timing diagram showing a model of timing charts of signals relevant to operations carried out by the bootstrap circuit implemented in accordance with the seventh embodiment as shown in the circuit diagram of FIG. 15.

FIG. 15 is a circuit diagram showing a typical configuration of a bootstrap circuit implemented in accordance with the seventh embodiment to serve as a bootstrap circuit provided at the first stage of the scan circuit 101. In the same way as the bootstrap circuit provided in accordance with the first embodiment described earlier, the bootstrap circuit provided in accordance with the seventh embodiment employs the first transistor $Tr_1$, the second transistor $Tr_2$ and the third transistor $Tr_1$ which have the same conduction type. Also in the case of the seventh embodiment, the conduction type is the n-channel conduction type. FIG. 16 is a timing diagram showing a model of timing charts of signals relevant to operations carried out by the bootstrap circuit shown in the circuit diagram of FIG. 15.

In the same way as the bootstrap circuit provided in accordance with the first embodiment described earlier, in the bootstrap circuit provided in accordance with the seventh embodiment:

(A-1) a specific one of the source and drain areas of the first transistor $Tr_1$ and a specific one of the source and drain areas of the second transistor $Tr_2$ are connected to each other by an output section $OUT_1$ of the bootstrap circuit;

(A-2) the other one of the source and drain areas of the first transistor $Tr_1$ is connected to a clock supply line which conveys a specific one of two clock signals $CK_1$ and $CK_2$ having phases different from each other (in the case of the bootstrap circuit provided in accordance with the seventh embodiment of the present invention, the specific one of the two clock signals $CK_1$ and $CK_2$ is the clock signal $CK_1$ as shown in the circuit diagram of FIG. 15);

(A-3) the gate electrode of the first transistor $Tr_1$ and a specific one of the source and drain areas of the third transistor $Tr_3$ are connected to each other by a node section $P_1$;

(B-1) the other one of the source and drain areas of the second transistor $Tr_2$ is connected to a first voltage supply line $PS_1$ conveying a first predetermined voltage $V_s$, which is set at a typical electric potential of 0 V;

(C-1) the other one of the source and drain areas of the third transistor $Tr_3$ is connected to a signal supply line which conveys an input signal $IN_1$ supplied to the bootstrap circuit;

(C-2) the gate electrode of the third transistor $Tr_3$ is connected to a clock supply line which conveys the other one of the two clock signals $CK_1$ and $CK_2$ (in the case of the bootstrap circuit provided in accordance with the seventh embodiment of the present invention, the other one of the two clock signals $CK_1$ and $CK_2$ is the clock signal $CK_2$ as shown in the circuit diagram of FIG. 15); and the node section $P_1$ connecting the gate electrode of the first transistor $Tr_1$ and the specific one of the source and drain areas of the third transistor $Tr_3$ to each other is put in a floating state when the third transistor $Tr_3$ is put in a turned-off state.

In the bootstrap circuit provided in accordance with the seventh of the present invention:

the gate electrode of the second transistor $Tr_2$ is connected to the clock supply line which conveys the other one (that is the clock signal $CK_2$ in this case) of the two clock signals $CK_1$ and $CK_2$ having phases different from each other;

the bootstrap circuit is provided with at least one of circuit sections each employing a fourth transistor $Tr_{74}$ and a fifth transistor $Tr_{75}$ which have the same conduction type as the first transistor $Tr_1$ to the third transistor $Tr_3$ (in the case of the bootstrap circuit provided in accordance with the seventh embodiment of the present invention, the conduction types of the first transistor $Tr_1$ to the third transistor $Tr_3$, the fourth transistor $Tr_{74}$ and the fifth transistor $Tr_{75}$ are the re-channel conduction type);

in each of the circuit sections:

(F-1) the gate electrode of the fourth transistor $Tr_{74}$ is connected by a node section $Q_1$ to a specific one of the source and drain areas of the fifth transistor $Tr_{75}$; and (F-2) the other one of the source and drain areas of the fifth transistor $Tr_{75}$ is connected to the signal supply line which conveys the input signal $IN_1$; and the specific one (that is the clock signal $CK_1$ in this case) of the two clock signals having phases different from each other is supplied to the other one of the source and drain areas of the first transistor $Tr_1$ by way of the fourth transistor $Tr_{74}$ connected in series between the clock supply line supplying the specific one of the two clock signals and the other one of the source and drain areas of the first transistor $Tr_1$. The bootstrap circuit provided in accordance with the seventh embodiment of the present invention can be configured to include a capacitor $C_b$ wired between the output section $OUT_1$ and the node section $Q_1$ connecting the gate electrode of the fourth transistor $Tr_{74}$ to the specific one of the source and drain areas of the fifth transistor $Tr_{75}$ to serve as a bootstrap supplementary capacitor.

As is obvious from the circuit diagram of FIG. 15, in accordance with the configuration of the bootstrap circuit, also in the circuit section employing the fourth transistor $Tr_{74}$ and the fifth transistor $Tr_{75}$, a bootstrap operation takes place. The gate electrode of the fourth transistor $Tr_{74}$ and the specific one of the source and drain areas of the fifth transistor $Tr_{75}$ together form the node section $Q_1$ which enters a floating state when the fifth transistor $Tr_{75}$ is put in a turned-off state. One of the source and drain areas of the fourth transistor $Tr_{74}$ is connected by a node section $R_1$ to the other one of the source and drain areas of the first transistor $Tr_1$. The other one of the source and drain areas of the fourth transistor $Tr_{74}$ is connected to the first clock supply line which conveys the first clock signal $CK_1$. The node section $R_1$ is affected by the first clock signal $CK_1$ with ease. Thus, in order to prevent the bootstrap supplementary capacitor $C_b$ from being affected with ease by operations other than the bootstrap operations, the bootstrap supplementary capacitor $C_b$ is connected to the output section $OUT_1$ instead of being connected to the node section $R_1$. As described above, the bootstrap circuit provided in accordance with the seventh embodiment has a configuration including a plurality of such circuit sections connected in parallel in each of which a bootstrap operation takes place. Reference notation $C_{74}$ denotes a parasitic capacitor between the gate electrode of the fourth transistor $Tr_{74}$ and the other one of the source and drain areas included in the fourth transistor $Tr_{74}$ as an area connected to the first clock supply line which conveys the first clock signal $CK_1$. On the other hand, reference notation $C_{75}$ denotes a parasitic capacitor between the gate electrode of the fifth transistor $Tr_{75}$ and the specific one of the source and drain areas of the fifth transistor $Tr_{75}$.

In the description of the first embodiment, operations carried out by the bootstrap circuit in related art are explained by taking parasitic capacitors included in the bootstrap circuit in related art into consideration with reference to the diagrams of FIGS. 3A and 3B. In the bootstrap circuit shown in the circuit diagram of FIG. 3A, as described earlier, the gate electrode of the first transistor $Tr_1$ is a portion of the node section $P_1$ whereas the first clock signal $CK_1$ is supplied to the other one of the source and drain areas of the first transistor $Tr_1$. The gate electrode of the first transistor $Tr_1$ is electro-statically coupled by the parasitic capacitor $C_1$ with the other one of the source and drain areas of the first transistor $Tr_1$. In the time periods $T_2$ and $T_6$ shown in the timing diagram of FIG. 3B for example, the electric potential appearing on the node section $P_1$ rises on the rising edge of the first clock signal $CK_1$. As described above, the first clock signal $CK_1$ is supplied to the other one of the source and drain areas of the first transistor $Tr_1$. Thus, if the electric potential appearing on the node section $P_1$ rises undesirably to a level of an order enabling a leak current to flow through the first transistor $Tr_1$, the first clock signal $CK_1$ results in the leak current which raises an electric potential appearing on the output section $OUT_1$. As a result, there is raised a problem that the electric potential appearing on the output section $OUT_1$ cannot be sustained at a low level during the time periods $T_2$ and $T_6$ as shown in the timing diagram of FIG. 3B.

In the bootstrap circuit shown in the circuit diagram of FIG. 15, the same phenomenon as the phenomenon explained earlier by referring to the circuit diagram of FIG. 3A as a phenomenon occurring for the node section $P_1$ occurs for the node section $Q_1$. In the case of the bootstrap circuit shown in the circuit diagram of FIG. 15, the gate electrode of the fourth transistor $Tr_{74}$ is a portion of the node section $Q_1$ whereas the first clock signal $CK_1$ is supplied to one of the source and drain areas of the fourth transistor $Tr_{74}$. The gate electrode of the fourth transistor $Tr_{74}$ is electro-statically coupled by a parasitic capacitor $C_{74}$ with the one of the source and drain areas of the fourth transistor $Tr_{74}$. In the time periods $T_2$ and $T_6$ shown in the timing diagram of FIG. 16 for example, the electric potential appearing on the node section $Q_1$ rises on the rising edge of the first clock signal $CK_1$.

In the bootstrap circuit shown in the circuit diagram of FIG. 15, in comparison with fluctuations of the first clock signal $CK_1$, however, fluctuations of the electric potential appearing on the node section $R_1$ are relatively small except during a bootstrap operation. Thus, abrupt level changes propagating to the node section $P_1$ due to the fluctuations of the electric potential appearing on the node section $R_1$ are also small as well so that changes of the electric potential appearing on the node section $P_1$ of the bootstrap circuit shown in the circuit diagram of FIG. 15 can be repressed more than the changes of the electric potential appearing on the node section $P_1$ of the bootstrap circuit shown in the circuit diagram of FIG. 3A are repressed.

As described above, it is also possible to provide a configuration including two or more circuit sections each employing a fourth transistor $Tr_{74}$ and a fifth transistor $Tr_{75}$ which have the same conduction type such as the n-channel conduction type as that of the first transistor $Tr_1$, the second transistor $Tr_2$ and the third transistor $Tr_1$. In such a configuration, changes of the electric potential appearing on the node section $P_1$ of the bootstrap circuit shown in the circuit diagram of FIG. 15 can be repressed even better.

Figure 17:
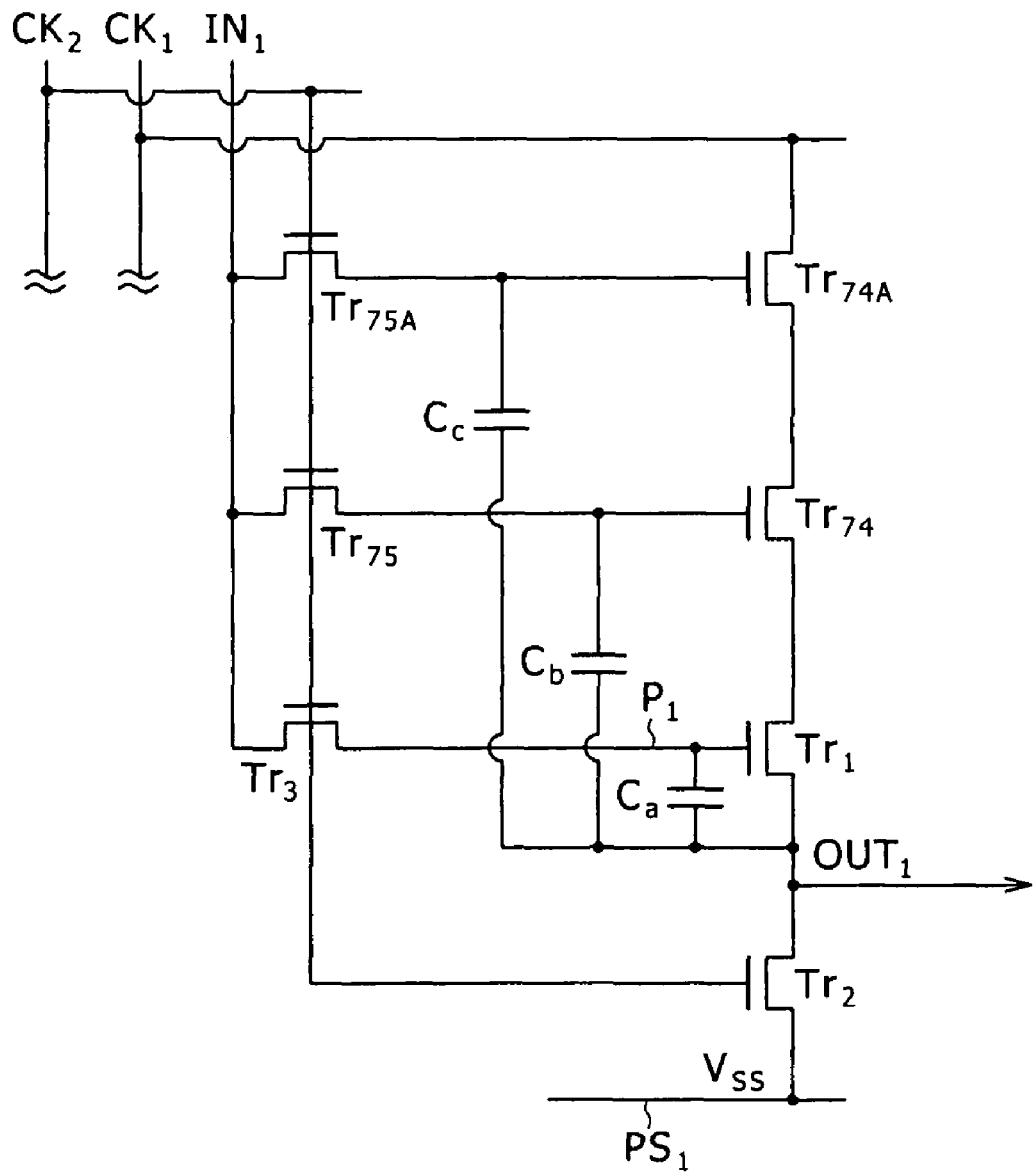
FIG. 17 is a circuit diagram showing a configuration obtained by adding a circuit section employing another fourth transistor and another fifth transistor to the configuration already including a circuit section employing a fourth transistor and a fifth transistor as shown in the circuit diagram of FIG. 15.

FIG. 17 is a circuit diagram showing a configuration obtained by adding a circuit section employing a fourth transistor $Tr_{74A}$ and a fifth transistor $Tr_{75A}$ to the configuration already including a circuit section employing a fourth transistor $Tr_{74}$ and a fifth transistor $Tr_{75}$ as shown in the circuit diagram of FIG. 15. In the configuration shown in the circuit diagram of FIG. 17, a specific one of the two clock signals $CK_1$ and $CK_2$ having phases different from each other is supplied to the other one of the source and drain areas of the first transistor $Tr_1$ by way of the fourth transistor $Tr_{74A}$ and the fourth transistor $Tr_{74}$ connected in series to each other. It is to be noted that, for the sake of simplicity, circuit diagrams of FIG. 17 and subsequent figures do not show parasitic capacitors.

Figure 18A:
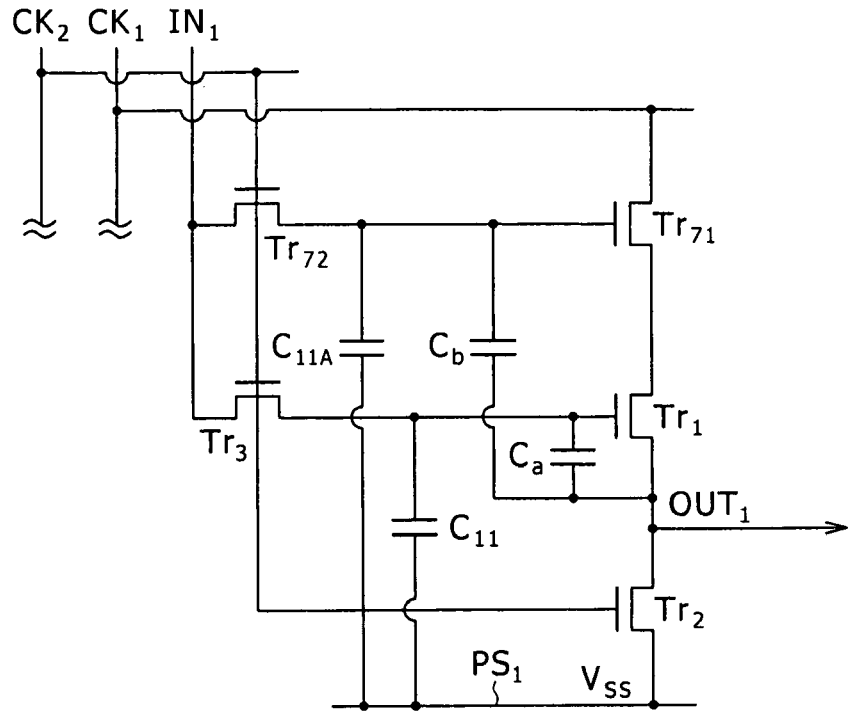
FIG. 18A is a circuit diagram showing a configuration including an additional voltage-variation repression capacitor added to the bootstrap circuit according to the seventh embodiment shown in the circuit diagram of FIG. 15 to serve as a capacitor in addition to a voltage-variation repression capacitor corresponding to a the voltage-variation repression capacitor employed in bootstrap circuit provided in accordance with the first embodiment shown in the circuit diagram of FIG. 4A.
Figure 18B:
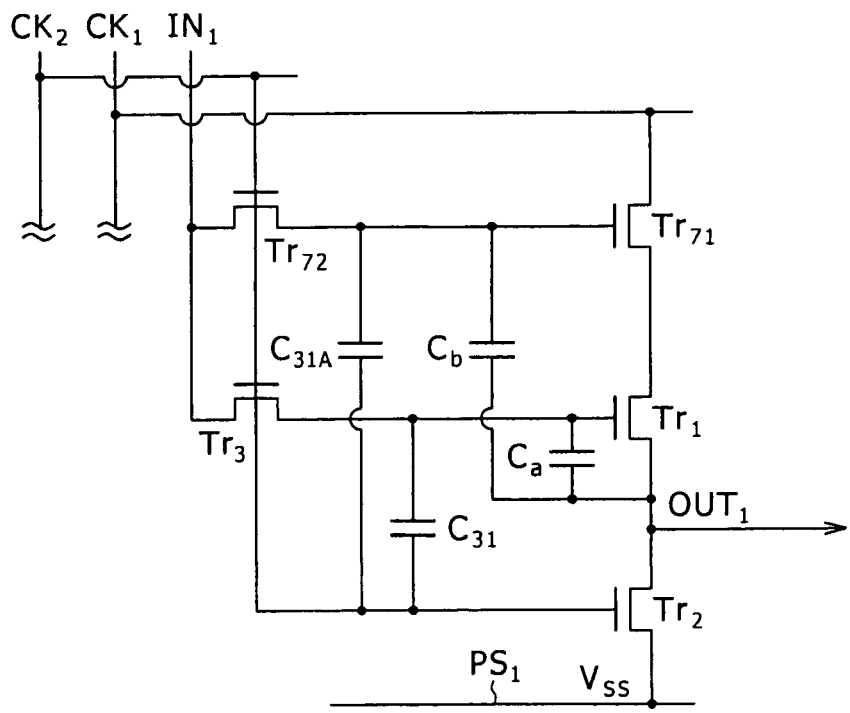
FIG. 18B is a circuit diagram showing a configuration including an additional voltage-variation capacitor added to the bootstrap circuit according to the seventh embodiment shown in the circuit diagram of FIG. 15 to serve as a capacitor in addition to a voltage-variation repression capacitor corresponding to the voltage-variation repression capacitor employed in bootstrap circuit provided in accordance with the third embodiment shown in the circuit diagram of FIG. 8A.

It is also worth noting that the configuration of the bootstrap circuit according to the seventh embodiment can be further provided with a voltage-variation repression capacitor in addition to the voltage-variation repression capacitor $C_{11}$ employed in bootstrap circuit according to the first embodiment shown in the circuit diagram of FIG. 4A or further provided with a voltage-variation repression capacitor in addition to the voltage-variation repression capacitor $C_{31}$ employed in bootstrap circuit according to the third embodiment shown in the circuit diagram of FIG. 8A. FIG. 18A is a circuit diagram showing a configuration including an additional voltage-variation repression capacitor $C_{11A}$ added to the bootstrap circuit according to the seventh embodiment shown in the circuit diagram of FIG. 15 to serve as a capacitor in addition to a voltage-variation repression capacitor $C_{11}$ corresponding to the voltage-variation repression capacitor $C_{11}$ employed in bootstrap circuit provided in accordance with the first embodiment shown in the circuit diagram of FIG. 4A whereas FIG. 18B is a circuit diagram showing a configuration including an additional voltage-variation capacitor $C_{31A}$ added to the bootstrap circuit according to the seventh embodiment shown in the circuit diagram of FIG. 15 to serve as a capacitor in addition to a voltage-variation repression capacitor $C_{31}$ corresponding to the voltage-variation repression capacitor $C_{31}$ employed in bootstrap circuit provided in accordance with the third embodiment shown in the circuit diagram of FIG. 8A.

Figure 19:
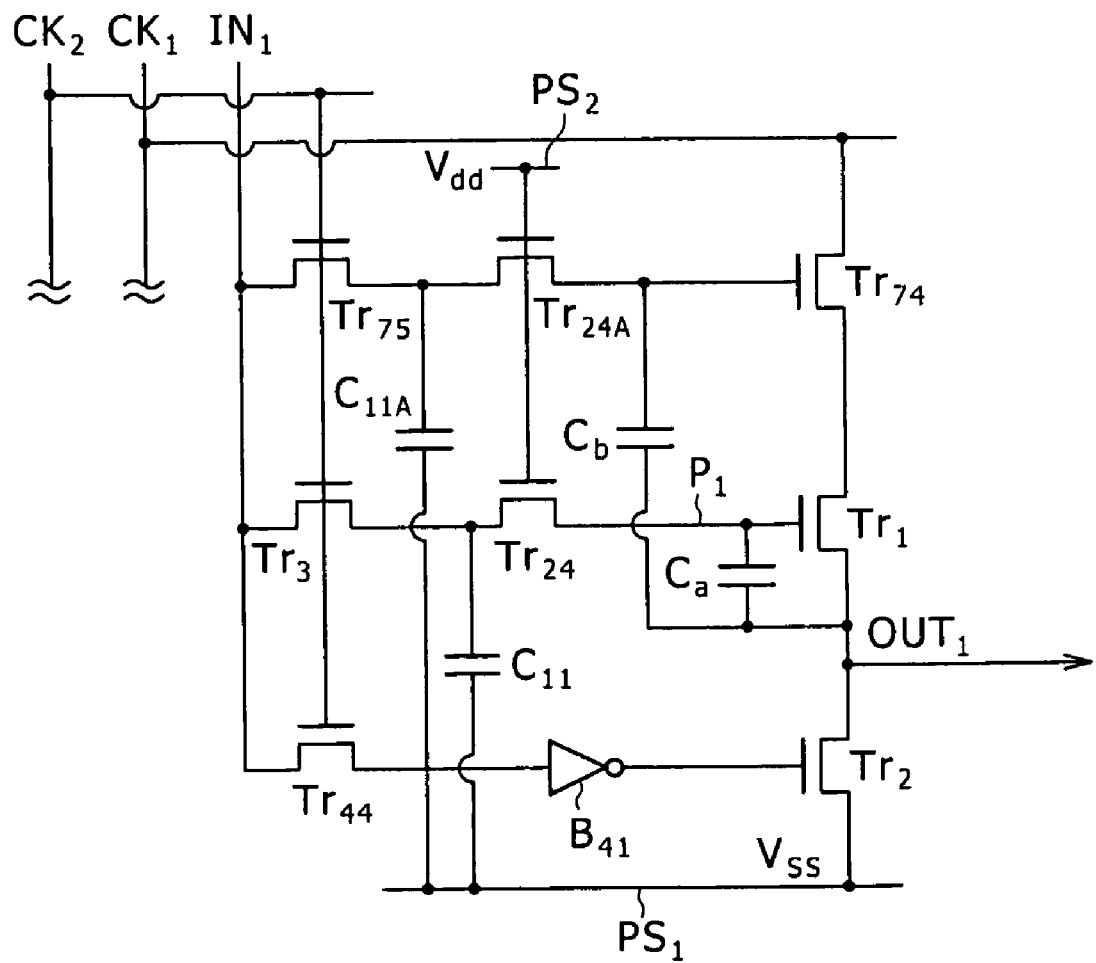
FIG. 19 is a circuit diagram showing a typical configuration of a bootstrap circuit obtained by properly combining the characteristics of the configurations of the first to seventh embodiments.

The preferred first to seventh embodiments of the present invention have been described so far. However, the scope of the present invention is by no means limited to these embodiments. The structure and configuration of each of the bootstrap circuits each provided in accordance with one of the first to seventh embodiments are only typical and can therefore be modified properly. FIG. 19 is a circuit diagram showing a typical configuration of a bootstrap circuit obtained by properly combining the characteristics of the configurations of the first to seventh embodiments.

As described above, every transistor employed in each of the first to seventh embodiments is a transistor of the n-channel type. However, each of the transistors does not have to be a transistor of the n-channel type. That is to say, each of the transistors can be a transistor of the p-channel type. If each of the transistors is a transistor of the p-channel type in the configuration of a bootstrap circuit, basically, the configuration needs to be changed so that the first voltage supply line $PS_1$ is used for conveying the second voltage $V_{dd}$ whereas the second voltage supply line $PS_2$ is used for conveying the first voltage $V_{ss}$ in each of the first to seventh embodiments.

Figure 20A:
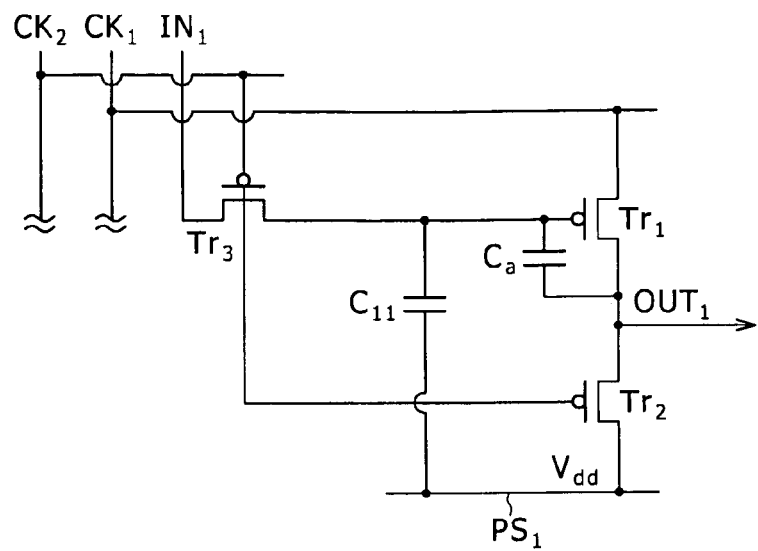
FIG. 20A is a circuit diagram showing a typical configuration of a bootstrap circuit composed of transistors, which are each created as a transistor of the p-channel type, to serve as a bootstrap circuit corresponding to the bootstrap circuit provided in accordance with the first embodiment at the first stage of the scan circuit as shown in the circuit diagram of FIG. 4A.
Figure 20B:
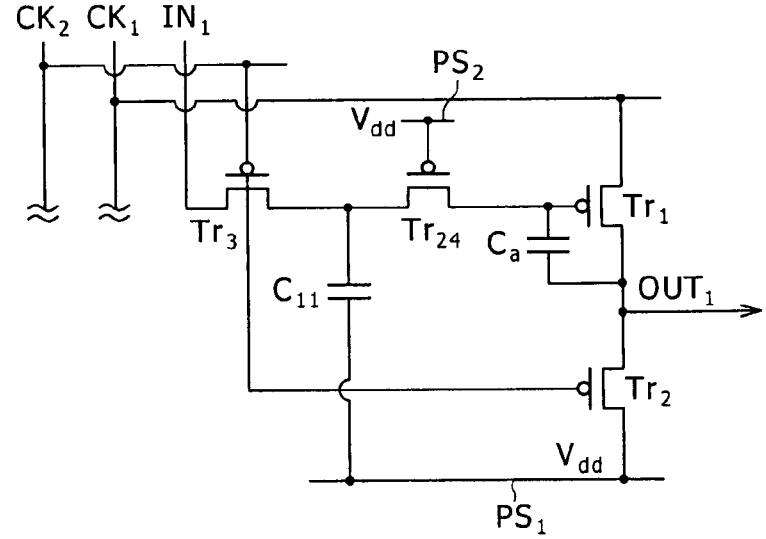
FIG. 20B is a circuit diagram showing a typical configuration of a bootstrap circuit composed of transistors, which are each created as a transistor of the p-channel type, to serve as a bootstrap circuit corresponding to the bootstrap circuit provided in accordance with the second embodiment as shown in the circuit diagram of FIG. 7A.
Figure 20C:
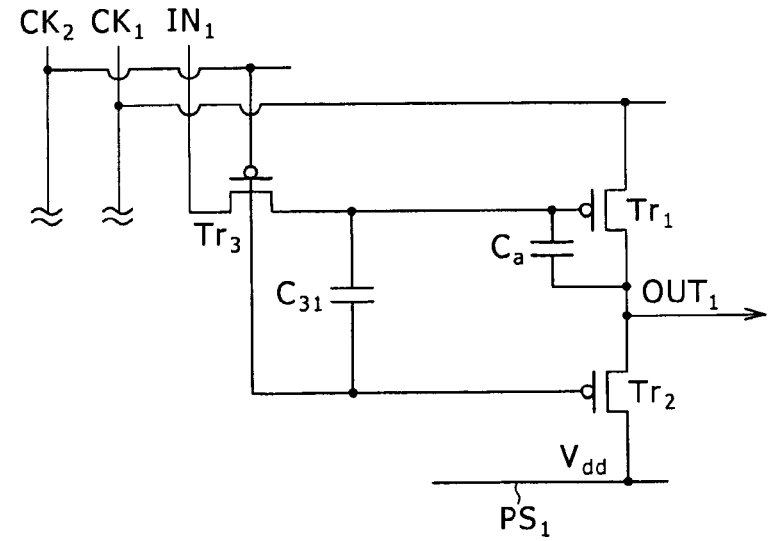
FIG. 20C is a circuit diagram showing a typical configuration of a bootstrap circuit composed of transistors, which are each created as a transistor of the p-channel type, to serve as a bootstrap circuit corresponding to the bootstrap circuit provided in accordance with the third embodiment as shown in the circuit diagram of FIG. 8A.

FIG. 20A is a circuit diagram showing a typical configuration of a bootstrap circuit composed of transistors, which are each created as a transistor of the p-channel type, to serve as a bootstrap circuit corresponding to the bootstrap circuit provided in accordance with the first embodiment at the first stage of the scan circuit 101 as shown in the circuit diagram of FIG. 4A. FIG. 20B is a circuit diagram showing a typical configuration of a bootstrap circuit composed of transistors, which are each created as a transistor of the p-channel type, to serve as a bootstrap circuit corresponding to the bootstrap circuit provided in accordance with the second embodiment as shown in the circuit diagram of FIG. 7A. FIG. 20C is a circuit diagram showing a typical configuration of a bootstrap circuit composed of transistors, which are each created as a transistor of the p-channel type, to serve as a bootstrap circuit corresponding to the bootstrap circuit provided in accordance with the third embodiment as shown in the circuit diagram of FIG. 8A.

Figure 21A:
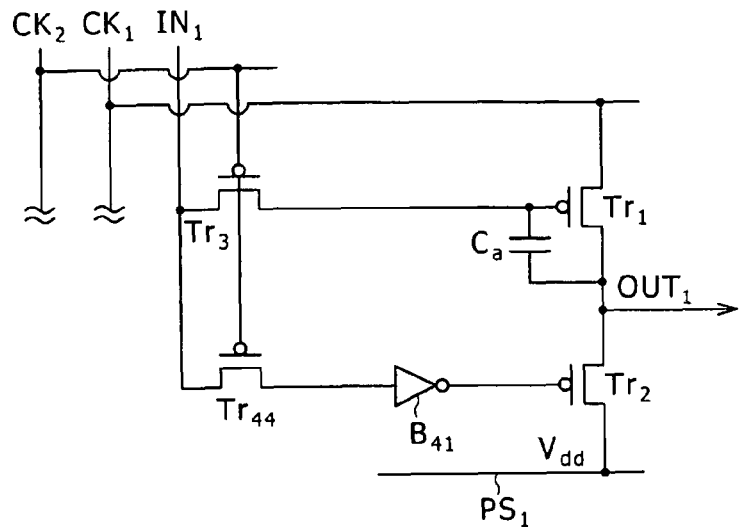
FIG. 21A is a circuit diagram showing a typical configuration of a bootstrap circuit composed of transistors, which are each created as a transistor of the p-channel type, to serve as a bootstrap circuit corresponding to the bootstrap circuit provided in accordance with the fourth embodiment as shown in the circuit diagram of FIG. 9.
Figure 21B:
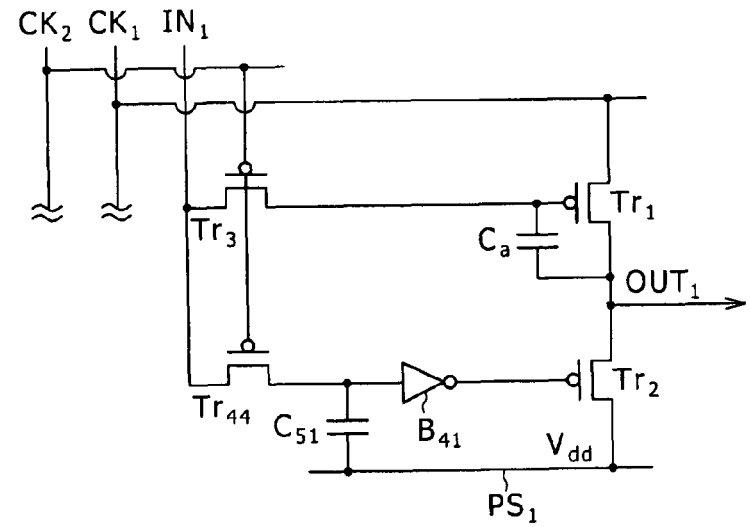
FIG. 21B is a circuit diagram showing a typical configuration of a bootstrap circuit composed of transistors, which are each created as a transistor of the p-channel type, to serve as a bootstrap circuit corresponding to the bootstrap circuit provided in accordance with the fifth embodiment as shown in the circuit diagram of FIG. 13.
Figure 21C:
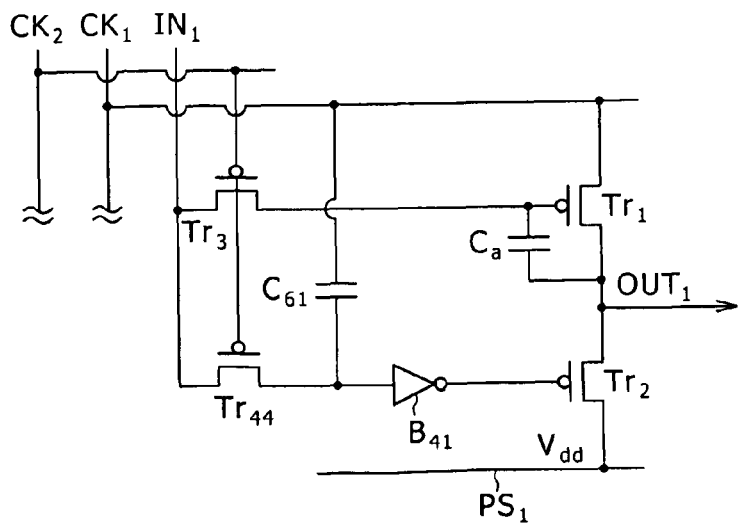
FIG. 21C is a circuit diagram showing a typical configuration of a bootstrap circuit composed of transistors, which are each created as a transistor of the p-channel type, to serve as a bootstrap circuit corresponding to the bootstrap circuit provided in accordance with the sixth embodiment as shown in the circuit diagram of FIG. 14.

FIG. 21A is a circuit diagram showing a typical configuration of a bootstrap circuit composed of transistors, which are each created as a transistor of the p-channel type, to serve as a bootstrap circuit corresponding to the bootstrap circuit provided in accordance with the fourth embodiment as shown in the circuit diagram of FIG. 9. FIG. 21B is a circuit diagram showing a typical configuration of a bootstrap circuit composed of transistors, which are each created as a transistor of the p-channel type, to serve as a bootstrap circuit corresponding to the bootstrap circuit provided in accordance with the fifth embodiment as shown in the circuit diagram of FIG. 13. FIG. 21C is a circuit diagram showing a typical configuration of a bootstrap circuit composed of transistors, which are each created as a transistor of the p-channel type, to serve as a bootstrap circuit corresponding to the bootstrap circuit provided in accordance with the sixth embodiment as shown in the circuit diagram of FIG. 14.

Figure 22A:
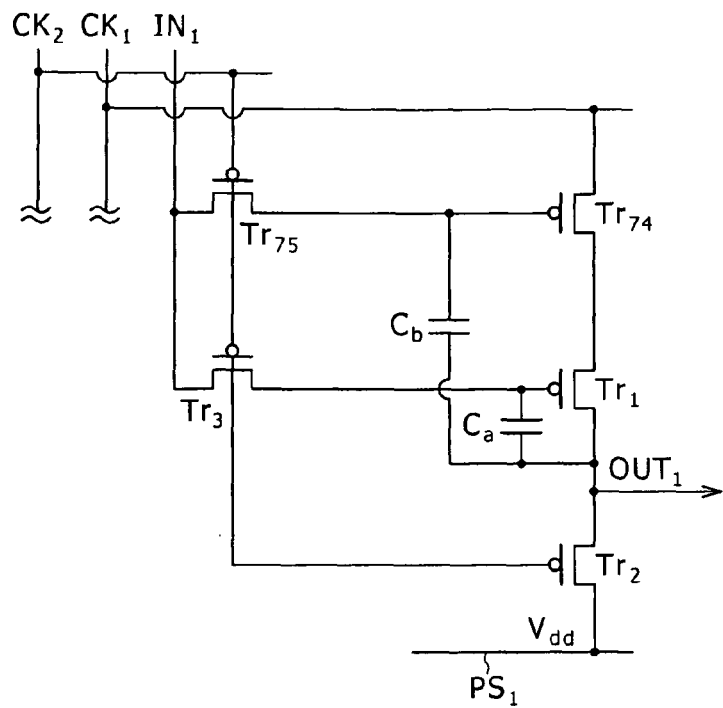
FIG. 22A is a circuit diagram showing a typical configuration of a bootstrap circuit composed of transistors, which are each created as a transistor of the p-channel type, to serve as a bootstrap circuit corresponding to the bootstrap circuit provided in accordance with the seventh embodiment as shown in the circuit diagram of FIG. 15.
Figure 22B:
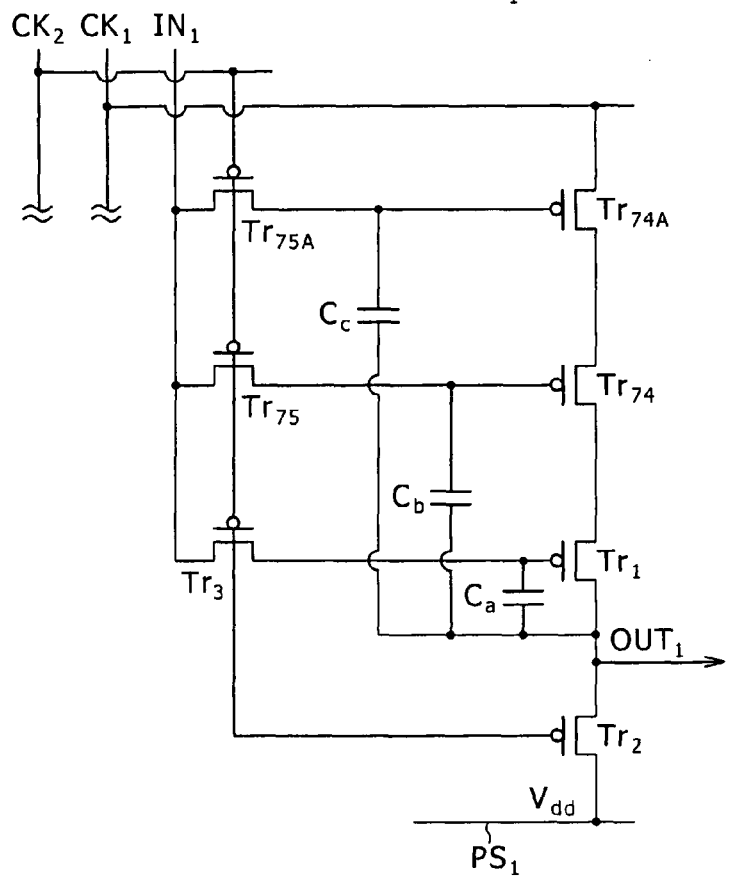
FIG. 22B is a circuit diagram showing a typical configuration of a bootstrap circuit composed of transistors, which are each created as a transistor of the p-channel type, also to serve as a bootstrap circuit corresponding to the bootstrap circuit provided in accordance with the seventh embodiment as shown in the circuit diagram of FIG. 17.

FIG. 22A is a circuit diagram showing a typical configuration of a bootstrap circuit composed of transistors, which are each created as a transistor of the p-channel type, to serve as a bootstrap circuit corresponding to the bootstrap circuit provided in accordance with the seventh embodiment as shown in the circuit diagram of FIG. 15. FIG. 22B is a circuit diagram showing a typical configuration of a bootstrap circuit composed of transistors, which are each created as a transistor of the p-channel type, also to serve as a bootstrap circuit corresponding to the bootstrap circuit provided in accordance with the seventh embodiment as shown in the circuit diagram of FIG. 17.

Figure 23A:
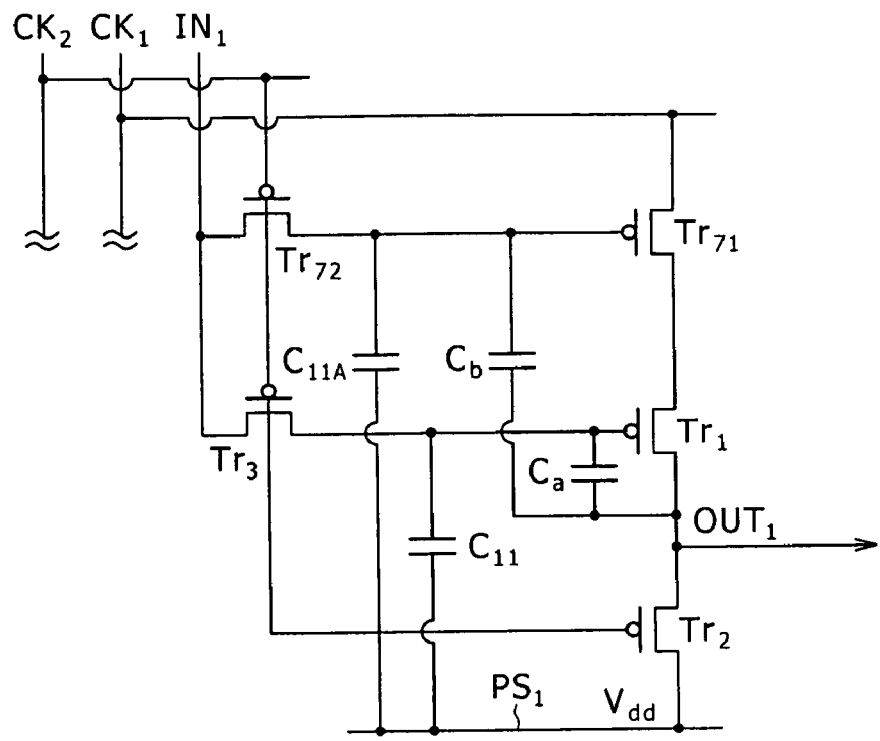
FIG. 23A is a circuit diagram showing a typical configuration of a bootstrap circuit composed of transistors, which are each created as a transistor of the p-channel type, to serve as a bootstrap circuit corresponding to the bootstrap circuit provided in accordance with the seventh embodiment as shown in the circuit diagram of FIG. 18A.
Figure 23B:
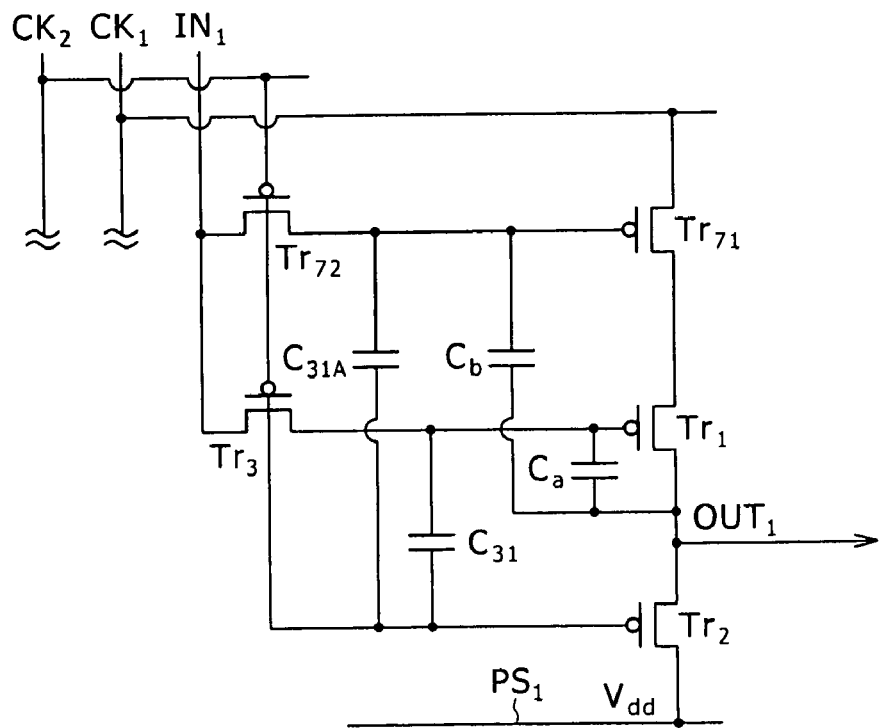
FIG. 23B is a circuit diagram showing a typical configuration of a bootstrap circuit composed of transistors, which are each created as a transistor of the p-channel type, also to serve as a bootstrap circuit corresponding to the bootstrap circuit provided in accordance with the seventh embodiment as shown in the circuit diagram of FIG. 18B.

FIG. 23A is a circuit diagram showing a typical configuration of a bootstrap circuit composed of transistors, which are each created as a transistor of the p-channel type, to serve as a bootstrap circuit corresponding to the bootstrap circuit provided in accordance with the seventh embodiment as shown in the circuit diagram of FIG. 18A. FIG. 23B is a circuit diagram showing a typical configuration of a bootstrap circuit composed of transistors, which are each created as a transistor of the p-channel type, also to serve as a bootstrap circuit corresponding to the bootstrap circuit provided in accordance with the seventh embodiment as shown in the circuit diagram of FIG. 18B.

Figure 24:
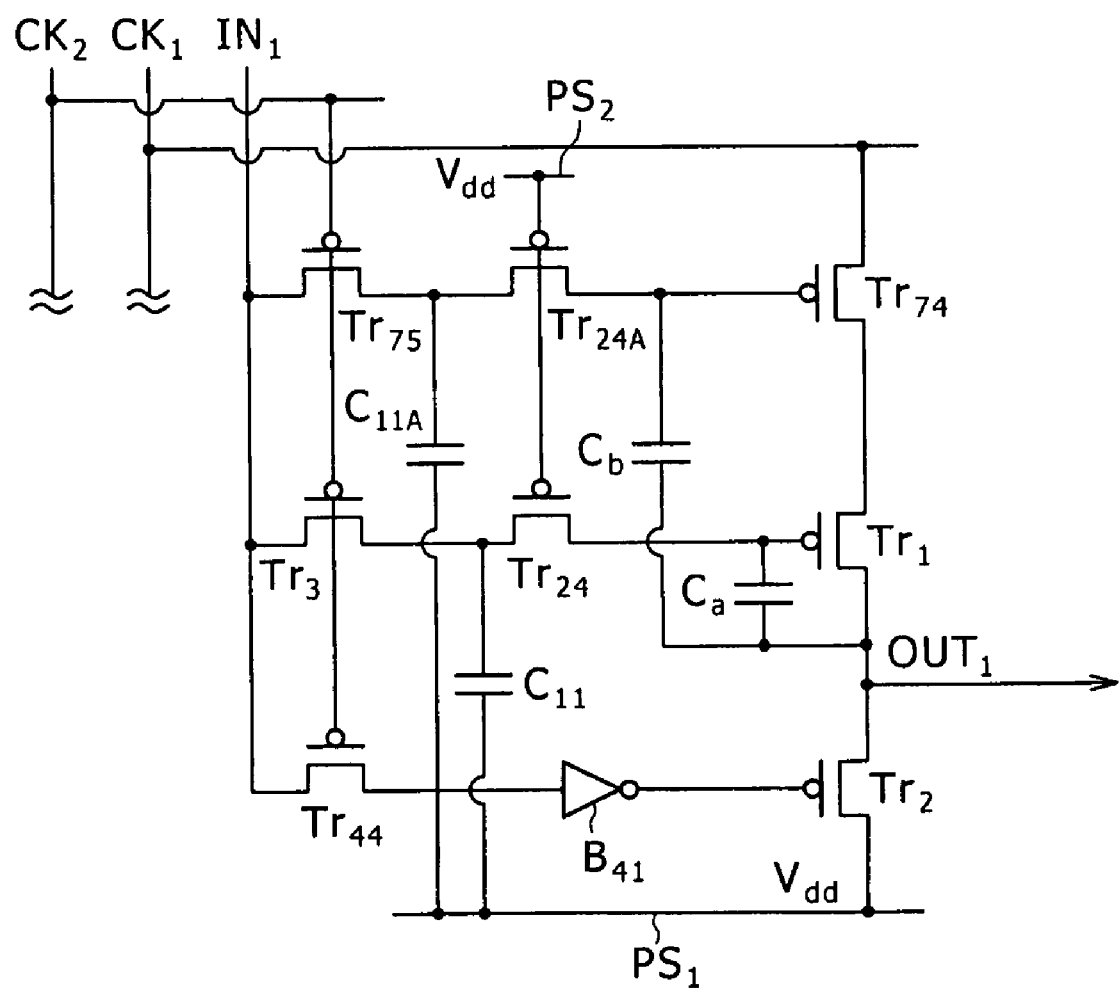
FIG. 24 is a circuit diagram showing a typical configuration of a bootstrap circuit composed of transistors, which are each created as a transistor of the p-channel type, to serve as a bootstrap circuit corresponding to the bootstrap circuit provided in accordance with the seventh embodiment as shown in the circuit diagram of FIG. 19.
Figure 25:
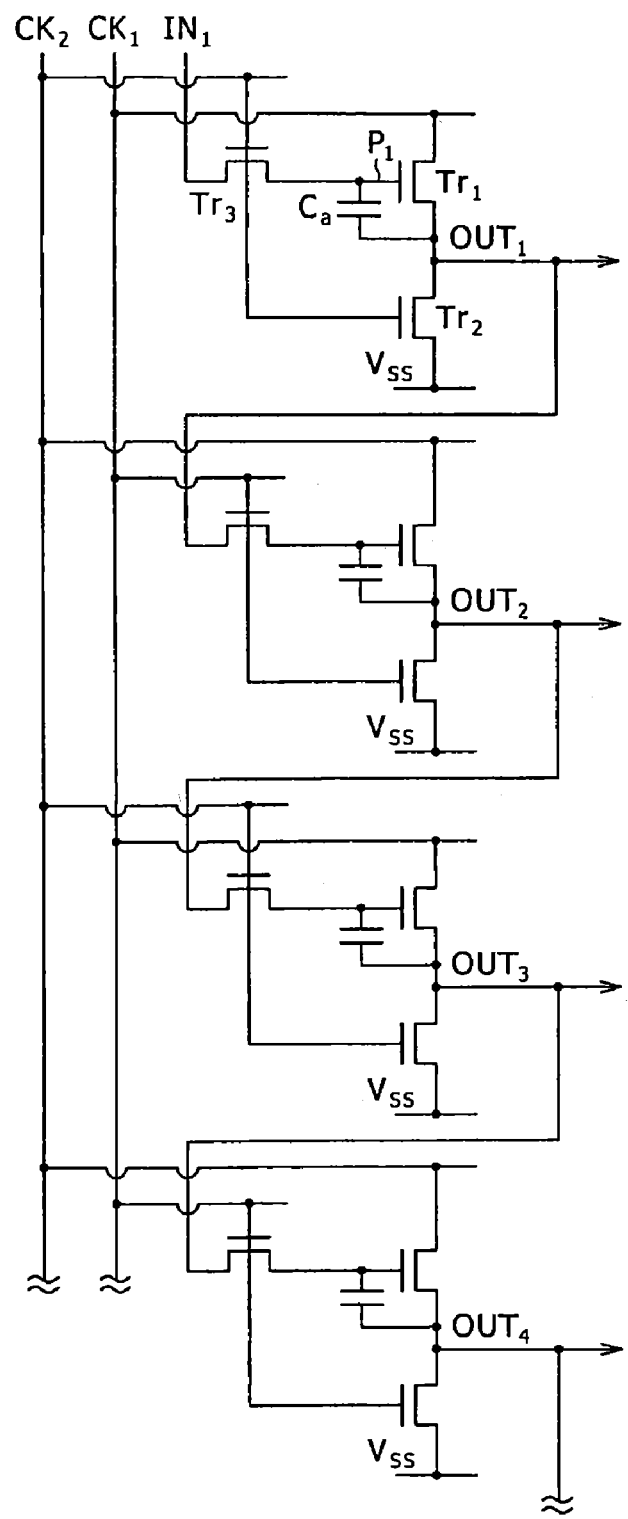
FIG. 25 is a circuit diagram showing a typical configuration of a shift register circuit provided with a bootstrap circuit, which basically employs three transistors, per stage.

FIG. 24 is a circuit diagram showing a typical configuration of a bootstrap circuit composed of transistors, which are each created as a transistor of the p-channel type, to serve as a bootstrap circuit corresponding to the bootstrap circuit provided in accordance with the first to seventh embodiments as shown in the circuit diagram of FIG. 19.

In addition, it should be understood by those skilled in the art that a variety of modifications, combinations, sub-combinations and alterations may occur, depending on design requirements and other factors as far as they are within the scope of the appended claims or the equivalents thereof.

What is claimed is:

1. A bootstrap circuit configured to employ first, second and third transistors of the same conduction type wherein:
   (A-1) a specific one of the source and drain areas of said first transistor and a specific one of the source and drain areas of said second transistor are connected to each other by an output section of said bootstrap circuit;
   (A-2) the other one of said source and drain areas of said first transistor is directly electrically connected to a clock supply line which conveys a specific one of two clock signals having phases different from each other;
   (A-3) the gate electrode of said first transistor and a specific one of the source and drain areas of said third transistor are connected to each other by a node section;
   (B-1) the other one of said source and drain areas of said second transistor is connected to a first voltage supply line which conveys a first predetermined voltage;
   (C-1) the other one of said source and drain areas of said third transistor is connected to a signal supply line which conveys an input signal supplied to said bootstrap circuit;
   (C-2) the gate electrode of said third transistor is directly electrically connected to a clock supply line which conveys the other one of said two clock signals;
   the gate electrode of said second transistor is directly electrically connected to said clock supply line which conveys said other one of said two clock signals; and
   a voltage-variation repression capacitor is provided between said node section and said first voltage supply line.

2. A bootstrap circuit comprising a first transistor, a second transistor, a third transistor, and a voltage-variation repression capacitor, wherein:
   a first source/drain area of the first transistor is connected to a first source/drain area of the second transistor, the first source/drain area of the first transistor and the first source/drain area of the second transistor being connected to an output section of the bootstrap circuit;
   a second source/drain area of the first transistor is directly electrically connected to a first clock supply line;
   a second source/drain area of the second transistor is connected to a first voltage supply line;
   a gate electrode of the second transistor is directly electrically connected to a second clock supply line;
   a gate electrode of the first transistor is connected to a first source/drain area of the third transistor by a node section;
   a second source/drain area of the third transistor is connected to a signal supply line, the signal supply line conveying an input signal supplied to the bootstrap circuit;
   a gate electrode of the third transistor is directly electrically connected to the second clock supply line; and
   the voltage-variation repression capacitor is connected between the node section and the first voltage supply line.

3. The bootstrap circuit according to claim 2, wherein the first transistor, the second transistor, and the third transistor are of a same conduction type.

4. The bootstrap circuit according to claim 2, wherein the first voltage supply line conveys a first predetermined voltage.

5. The bootstrap circuit according to claim 2, wherein the first clock supply line conveys a first clock signal and the second clock supply line conveys a second clock signal, the first clock signal having a phase different than a phase of the second clock signal.

6. The bootstrap circuit according to claim 5, wherein the voltage-variation repression capacitor has a capacitance such that electric-potential variations caused by abrupt changes generated by the first clock signal and abrupt changes generated by the second clock signal cancel each other.

* * * * *